United States Patent
Campbell et al.

(10) Patent No.: US 9,282,678 B2
(45) Date of Patent: Mar. 8, 2016

(54) FIELD-REPLACEABLE BANK OF IMMERSION-COOLED ELECTRONIC COMPONENTS AND SEPARABLE HEAT SINKS

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 169 days.

(21) Appl. No.: 14/058,592

(22) Filed: Oct. 21, 2013

(65) Prior Publication Data

US 2015/0109729 A1 Apr. 23, 2015

(51) Int. Cl.
*H05K 7/20* (2006.01)
*G06F 1/20* (2006.01)

(52) U.S. Cl.
CPC ............ *H05K 7/203* (2013.01); *H05K 7/20772* (2013.01); *H05K 7/20781* (2013.01); *H05K 7/20809* (2013.01)

(58) Field of Classification Search
CPC ..... H05K 7/203; H05K 7/20; H05K 7/20236; H05K 7/20218; H05K 7/20318; H01L 1/2344; H01L 1/23473; G06F 1/20

USPC ........................ 361/679.46–679.53, 688, 689, 361/698–702, 715–727; 165/80.2–80.5, 165/104.19, 104.33, 164–170, 185; 62/259.2, 259.3, 457.2, 457.9; 174/15.1, 16.3; 257/714
See application file for complete search history.

(56) References Cited

U.S. PATENT DOCUMENTS 3,417,814 A * 12/1968 Oktay ..................... 165/104.13
3,512,582 A    5/1970 Chu et al.
(Continued)

FOREIGN PATENT DOCUMENTS

JP        02114597 A1 *  4/1990  ............... H05K 7/20
JP        406061673 A1 *  3/1994  ............... H05K 7/20

OTHER PUBLICATIONS

Council et al., "Temperature Controlled Immersed Cooling System", IBM Technical Disclosure Bulletin, IPCOM000090118D, ePublished Mar. 5, 2005; TDB02-69, p. 1097-1098 (Feb. 1, 1969).
(Continued)

*Primary Examiner* — Michail V Datskovskiy
(74) *Attorney, Agent, or Firm* — Steven Chiu, Esq.; Kevin P. Radigan, Esq.; Heslin Rothenberg Farley & Mesiti P.C.

(57) ABSTRACT

Cooled electronic systems and cooling methods are provided, wherein a field-replaceable bank of electronic components is cooled by an apparatus which includes an enclosure at least partially surrounding and forming a compartment about the electronic components, a fluid disposed within the compartment, and a heat sink associated with the electronic system. The field-replaceable bank extends, in part, through the enclosure to facilitate operative docking of the electronic components into, for instance, one or more respective receiving sockets of the electronic system. The electronic components of the field-replaceable bank are, at least partially, immersed within the fluid to facilitate immersion-cooling of the components, and the heat sink is configured and disposed to physically couple to the enclosure and facilitates rejection of heat from the fluid disposed within the compartment when the field-replaceable bank of electronic components is operatively inserted into the electronic system.

19 Claims, 17 Drawing Sheets

(56) References Cited

U.S. PATENT DOCUMENTS

| | | | |
|---|---|---|---|
| 3,741,292 A | 6/1973 | Aakalu | |
| 3,851,221 A | 11/1974 | Beaulieu | |
| 3,858,090 A * | 12/1974 | Lehmann | 361/699 |
| 4,312,012 A | 1/1982 | Frieser | |
| 4,590,538 A | 5/1986 | Cray, Jr. | |
| 4,619,316 A * | 10/1986 | Nakayama et al. | 165/104.33 |
| 4,704,658 A * | 11/1987 | Yokouchi et al. | 361/698 |
| 4,970,868 A | 11/1990 | Grebe et al. | |
| 5,023,695 A | 6/1991 | Umezawa et al. | |
| 5,245,508 A | 9/1993 | Mizzi | |
| 5,720,338 A | 2/1998 | Larson et al. | |
| 6,019,167 A | 2/2000 | Bishop et al. | |
| 6,055,157 A | 4/2000 | Bartilson | |
| 6,111,749 A | 8/2000 | Lamb et al. | |
| 7,184,269 B2 | 2/2007 | Campbell et al. | |
| 7,365,982 B2 | 4/2008 | He | |
| 7,403,392 B2 * | 7/2008 | Attlesey et al. | 361/699 |
| 7,414,845 B2 * | 8/2008 | Attlesey et al. | 361/699 |
| 7,477,513 B1 | 1/2009 | Cader et al. | |
| 7,905,106 B2 * | 3/2011 | Attlesey | 62/259.2 |
| 7,936,560 B2 * | 5/2011 | Toyoda et al. | 361/679.52 |
| 7,983,040 B2 | 7/2011 | Campbell et al. | |
| 8,014,150 B2 | 9/2011 | Campbell et al. | |
| 8,094,454 B2 | 1/2012 | Lowry | |
| 8,305,759 B2 * | 11/2012 | Attlesey et al. | 361/701 |
| 8,699,225 B2 * | 4/2014 | Brandenburg et al. | 361/699 |
| 2007/0034360 A1 * | 2/2007 | Hall | 165/104.33 |
| 2007/0290311 A1 | 12/2007 | Hauenstein | |
| 2007/0297136 A1 * | 12/2007 | Konshak | 361/699 |
| 2008/0123297 A1 | 5/2008 | Tilton et al. | |
| 2009/0284924 A1 | 11/2009 | Konshak et al. | |
| 2011/0103019 A1 | 5/2011 | Campbell et al. | |
| 2011/0132579 A1 * | 6/2011 | Best et al. | 165/104.31 |
| 2011/0182033 A1 | 7/2011 | Tissot et al. | |
| 2012/0279233 A1 | 11/2012 | Chainer et al. | |
| 2012/0279686 A1 | 11/2012 | Chainer et al. | |
| 2012/0281358 A1 | 11/2012 | Chainer et al. | |
| 2013/0021752 A1 | 1/2013 | Campbell et al. | |
| 2015/0109728 A1 | 4/2015 | Campbell | |

OTHER PUBLICATIONS

Anderson et al., "Hermetically Sealed, Field Removable Module Having an Integral Pump and Coolant Heat Exchanger for Forced Convection Immersion Cooling of Electronic Circuit Modules", IBM Technical Disclosure Bulletin, IPCOM000109890D, ePublished Mar. 24, 2005; TDB n4b 09-92, p. 443-444 (Sep. 1, 1992).

Scott, G.W., "Enclosure with Heat Exchanger for Immersion Cooling", IBM Technical Disclosure Bulletin, IPCOM000106417D, ePublished Mar. 21, 2005; TDB vol. 36, No. 11, p. 121-122 (Nov. 1, 1993).

Scott, G.W., "Conduction Cooled Enclosure for Immersion Cooling" IBM Technical Disclosure Bulletin, IPCOM000106449D, ePublished Mar. 21, 2005; TDB vol. 26, No. 11, p. 207-208 (Nov. 1, 1993).

Green et al., "High-Density Immersion Cooled-Electronic Module", IBM Technical Disclosure Bulletin, IPCOM000111152D, ePublished Mar. 26, 2005; TDB vol. 37, No. 2A, 02-94, p. 393-394 (Feb. 1, 1994).

Anderson et al., "Liquid Immersion Cooling Scheme for Electronics Installed in an Open, Unsheltered Environment", IBM Technical Disclosure Bulletin, IPCOM000118180D, ePublished Apr. 1, 2005; TDB vol. 39, No. 10, 10-96, p. 161-162 (Oct. 1, 1996).

Anonymous, "Method for Localized Immersion Cooling" IBM Technical Disclosure Bulletin, IPCOM000008376D, ePublished Jun. 11, 2002.

Chu et al., "Advanced Cooling Technology for Leading-Edge Computer Products", Solid-State and Integrated Circuit Techology, 5th International Conference on IEEE Proceedings, pp. 559-562 (1998).

L. Campbell et al., "Immersion-Cooled and Conduction-Cooled Electronic System", U.S. Appl. No. 13/684,712, filed Nov. 26, 2012.

Campbell et al., Office Action for U.S. Appl. No. 14/058,581, filed Oct. 21, 2013 (U.S. Patent Publication No. 2015/0109728 A1), dated Oct. 7, 2015 (8 pages).

* cited by examiner

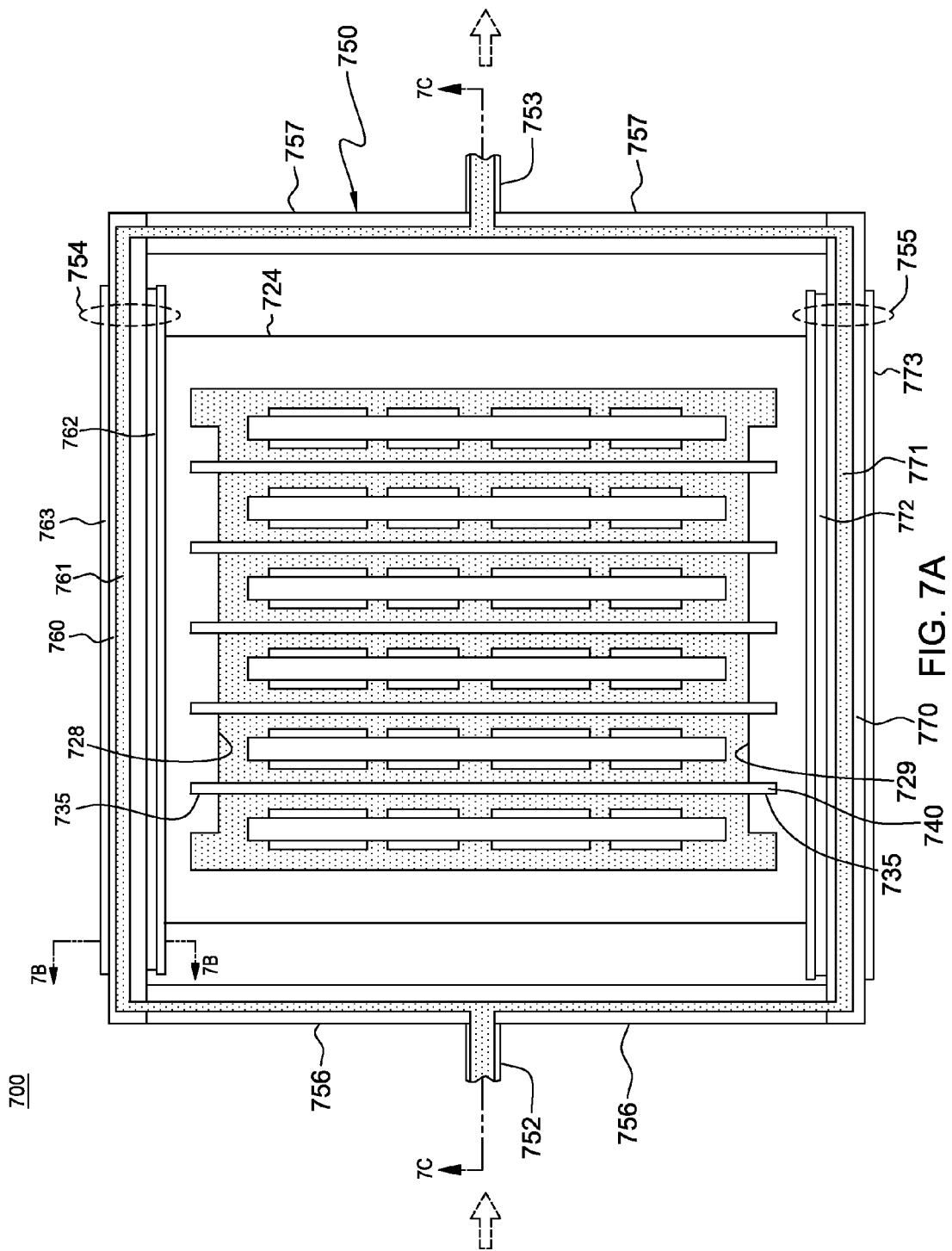

FIELD-REPLACEABLE BANK OF IMMERSION-COOLED ELECTRONIC COMPONENTS AND SEPARABLE HEAT SINKS

BACKGROUND

As is known, operating electronic components produce heat. This heat should be removed in an effective manner to maintain device junction temperatures within desirable limits, with failure to do so resulting in excessive component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to dissipate more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from electronic components with higher power density.

The need to cool current and future high heat load, high heat flux electronic devices therefore mandates the development of aggressive thermal management techniques using, for instance, liquid cooling.

BRIEF SUMMARY

The shortcomings of the prior art are overcome, and additional advantages are provided through the provision of a cooled electronic system which includes, for instance, an electronic system comprising a field-replaceable bank of electronic components, and a cooling apparatus facilitating cooling of the field-replaceable bank of electronic components. The cooling apparatus includes an enclosure at least partially surrounding and forming a compartment about, at least in part, the electronic components of the field-replaceable bank of electronic components, a fluid disposed within the compartment, and a heat sink associated with the electronic system. The field-replaceable bank of electronic components extends, in part, through the enclosure to facilitate operative insertion thereof into the electronic system. The electronic components of the field-replaceable bank of electronic components are, at least partially, immersed within the compartment in the fluid to facilitate immersion-cooling thereof, and the heat sink is configured and disposed to physically couple to the enclosure when the field-replaceable bank of electronic components is operatively inserted into the electronic system, and thereby facilitate rejection of heat through the enclosure from the fluid disposed within the compartment.

In another aspect, a liquid-cooled electronics rack is provided which includes an electronics rack having at least one electronic system, the at least one electronic system including a field-replaceable bank of electronic components. A cooling apparatus is also provided which facilitates cooling the field-replaceable bank of electronic components. The cooling apparatus includes an enclosure at least partially surrounding and forming a compartment about, at least in part, the electronic components of the field-replaceable bank of electronic components, a fluid disposed within the compartment, and a heat sink associated with one electronic system of the at least one electronic system of the electronics rack. The field-replaceable bank of electronic components extends, in part, through the enclosure to facilitate operative insertion thereof into the one electronic system. The electronic components of the field-replaceable bank of electronic components are, at least partially, immersed within the compartment in the fluid to facilitate immersion-cooling thereof, and the heat sink is configured and disposed to physically couple to the enclosure when the field-replaceable bank of electronic components is operatively inserted into the one electronic system, and thereby facilitate rejection of heat through the enclosure from the fluid disposed within the compartment.

In a further aspect, a method of facilitating cooling, at least in part, an electronic system is provided. The method includes: providing an electronic system comprising a field-replaceable bank of electronic components; and providing a cooling apparatus to facilitate cooling the field-replaceable bank of electronic components, the cooling apparatus including an enclosure at least partially surrounding and forming a compartment about, at least in part, the electronic components of the field-replaceable bank of electronic components, a fluid disposed within the compartment, and a heat sink associated with the electronic system. The field-replaceable bank of electronic components extends, in part, through the enclosure to facilitate operative insertion thereof into the electronic system. The electronic components of the field-replaceable bank of electronic components are, at least partially, immersed within the compartment in the fluid to facilitate immersion-cooling thereof, and the heat sink is configured and disposed to physically couple to the enclosure when the field-replaceable bank of electronic components is operatively inserted into the electronic system, and thereby facilitate rejection of heat through the enclosure from the fluid disposed within the compartment.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 7A is a plan view of one embodiment of a cooled electronic system including a field-replaceable bank of electronic components of the electronic system and a cooling apparatus therefor, taken along line 7A-7A in the cross-sectional elevational view thereof of FIG. 7C, in accordance with one or more aspects of the present invention;

DETAILED DESCRIPTION

Figure 1:
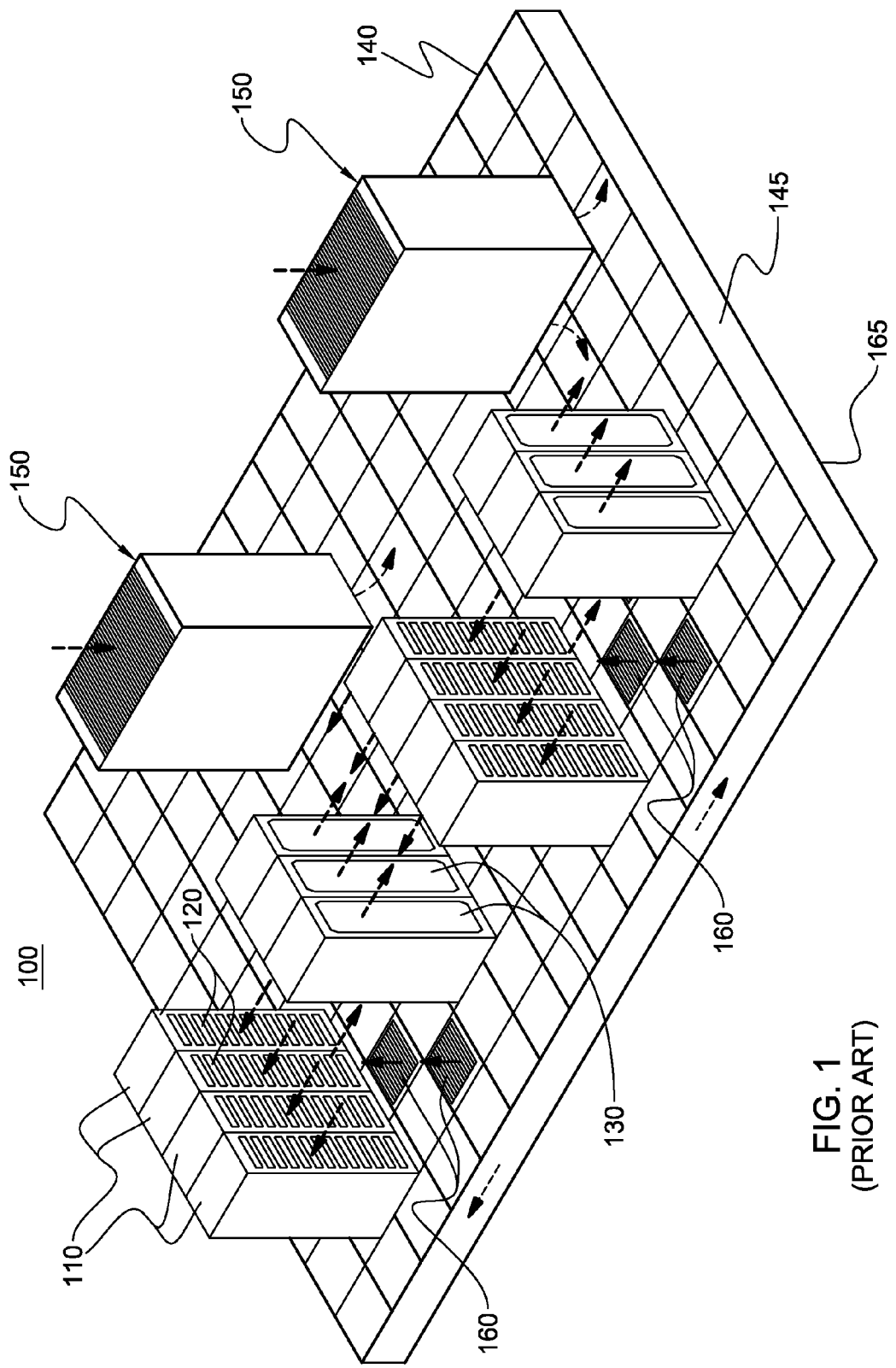
FIG. 1 depicts one embodiment of a conventional raised floor layout of an air-cooled computer installation.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" refers to any heat generating electronic component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled vapor condenser", "liquid-cooled heat sink", or "liquid-cooled thermal conductor" each refer to a thermally conductive structure having one or more channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

By way of further explanation, a "heat pipe" is a heat transfer device which combines the principles of both thermal conductivity and phase transition to effectively manage transfer of heat. A simple type of heat pipe includes a sealed case, an inner surface of which is covered with a layer of capillary or porous material, or structure comprising a wick which is saturated with the working fluid in its liquid phase. At a hot interface within the heat pipe, which may be at a low pressure, the working fluid within the heat pipe in contact with a thermally conductive surface (for example, an inner wall of the casing or a wick), turns into a vapor by absorbing heat from that surface. The working fluid vapor condenses back into a liquid at a cold interface of the heat pipe, releasing the latent heat. The working fluid liquid then returns to the hot interface through, for example, the wick structure by capillary action or gravity, where it evaporates once more and repeats the cycle. Internal pressure within the heat pipe can be set or adjusted to facilitate the phase change, depending on the demands of the working conditions of the cooling system.

One example of the coolants discussed herein, such as the facility coolant or system coolant, is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings, which are not drawn to scale to facilitate an understanding of the various aspects of the present invention, wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
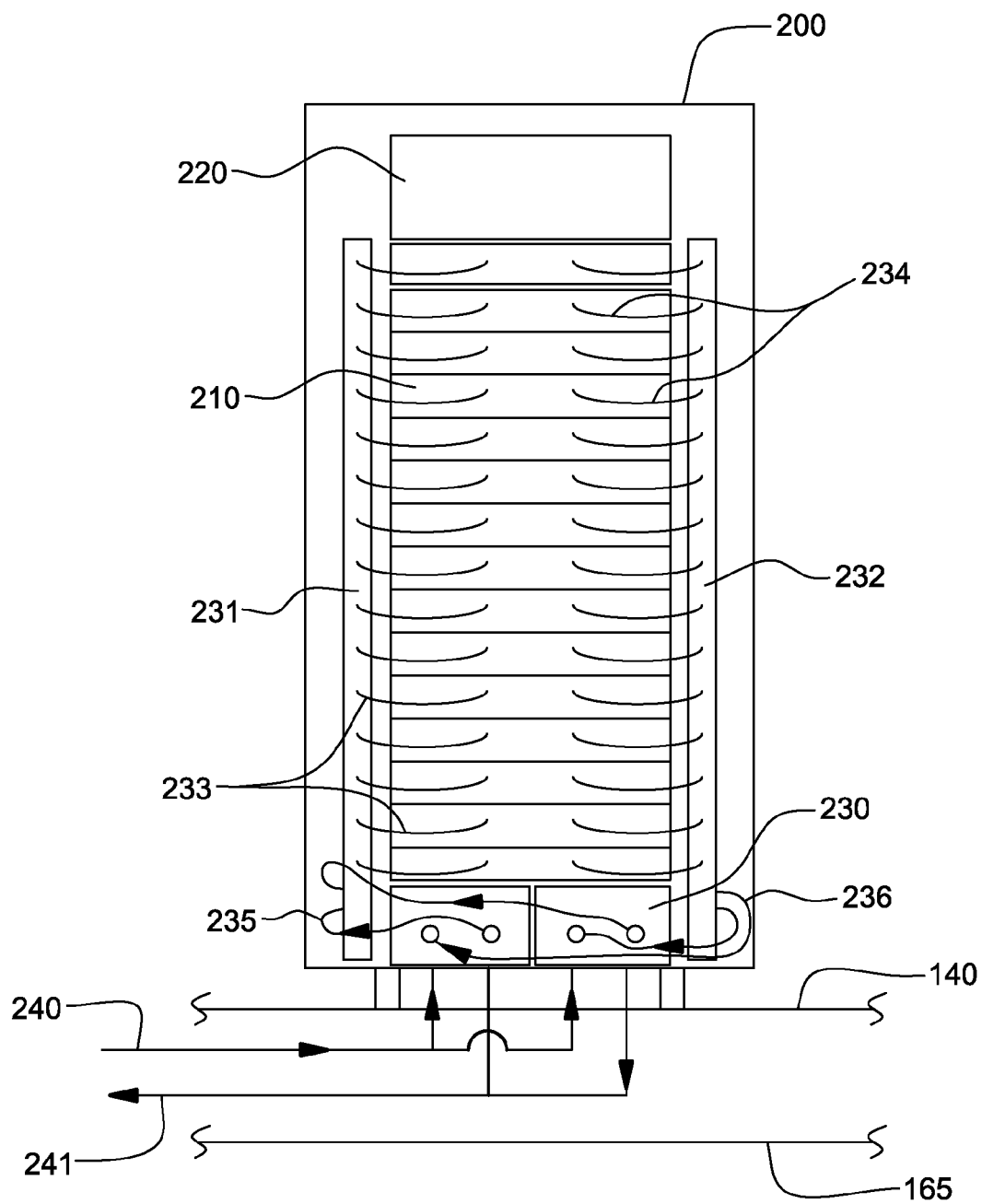
FIG. 2 is a front elevational view of one embodiment of an at least partially liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic systems 210 (for example, to liquid-cooled vapor condensers or liquid-cooled heat sinks (see FIGS. 6A-10) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 140 and base floor 165.

Figure 3:
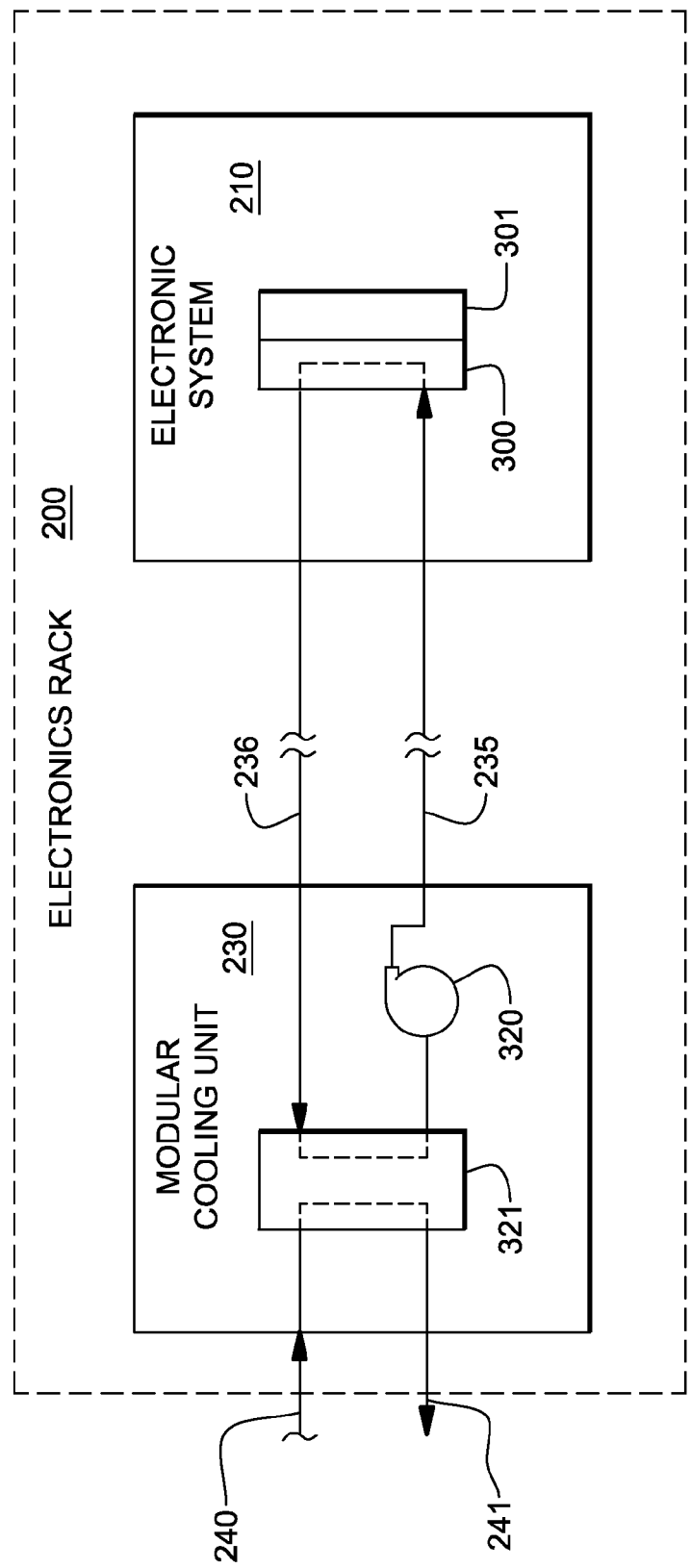
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
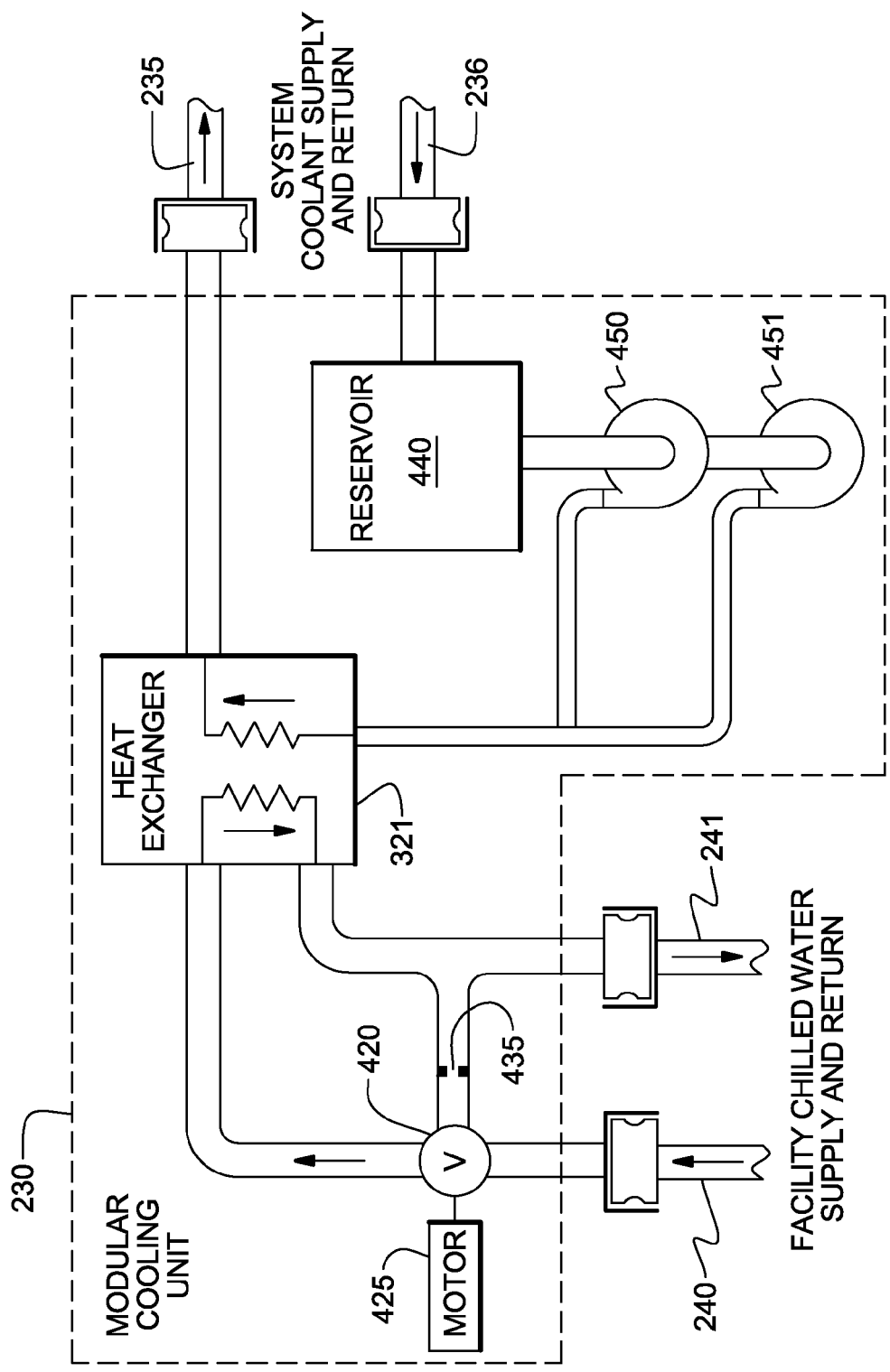
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
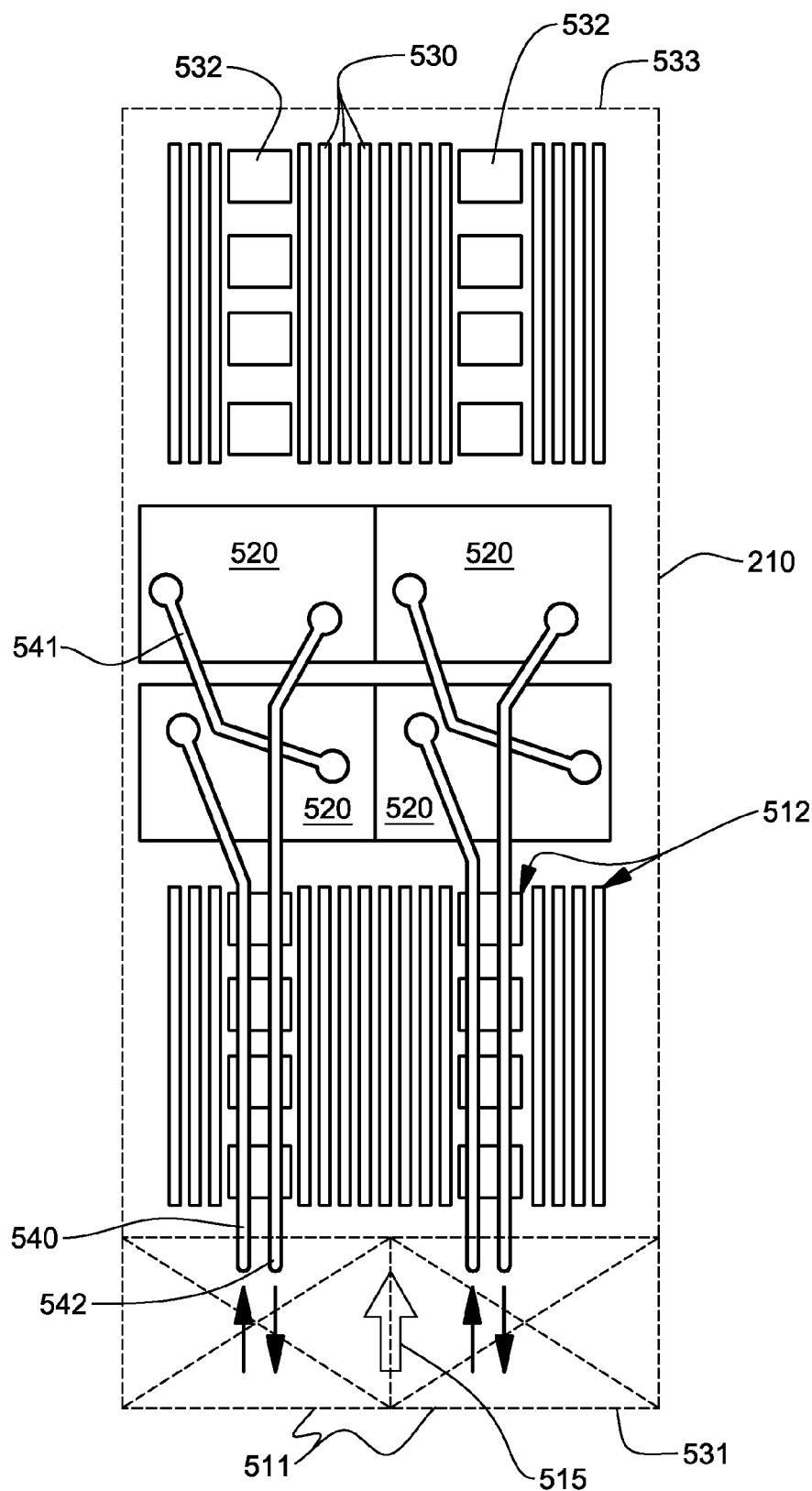
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic system using pumped liquid, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, the components to be cooled are immersed in a dielectric fluid that dissipates heat through boiling. The vapor is then condensed by a secondary, rack-level working (or system) fluid using node or module-level, finned condensers, as explained below.

Direct immersion-cooling of electronic components of an electronic system of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water-based cooling approach. For at least these potential benefits, dielectric fluid immersion-cooling of one or more electronic systems (or portions of one or more electronic systems) of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
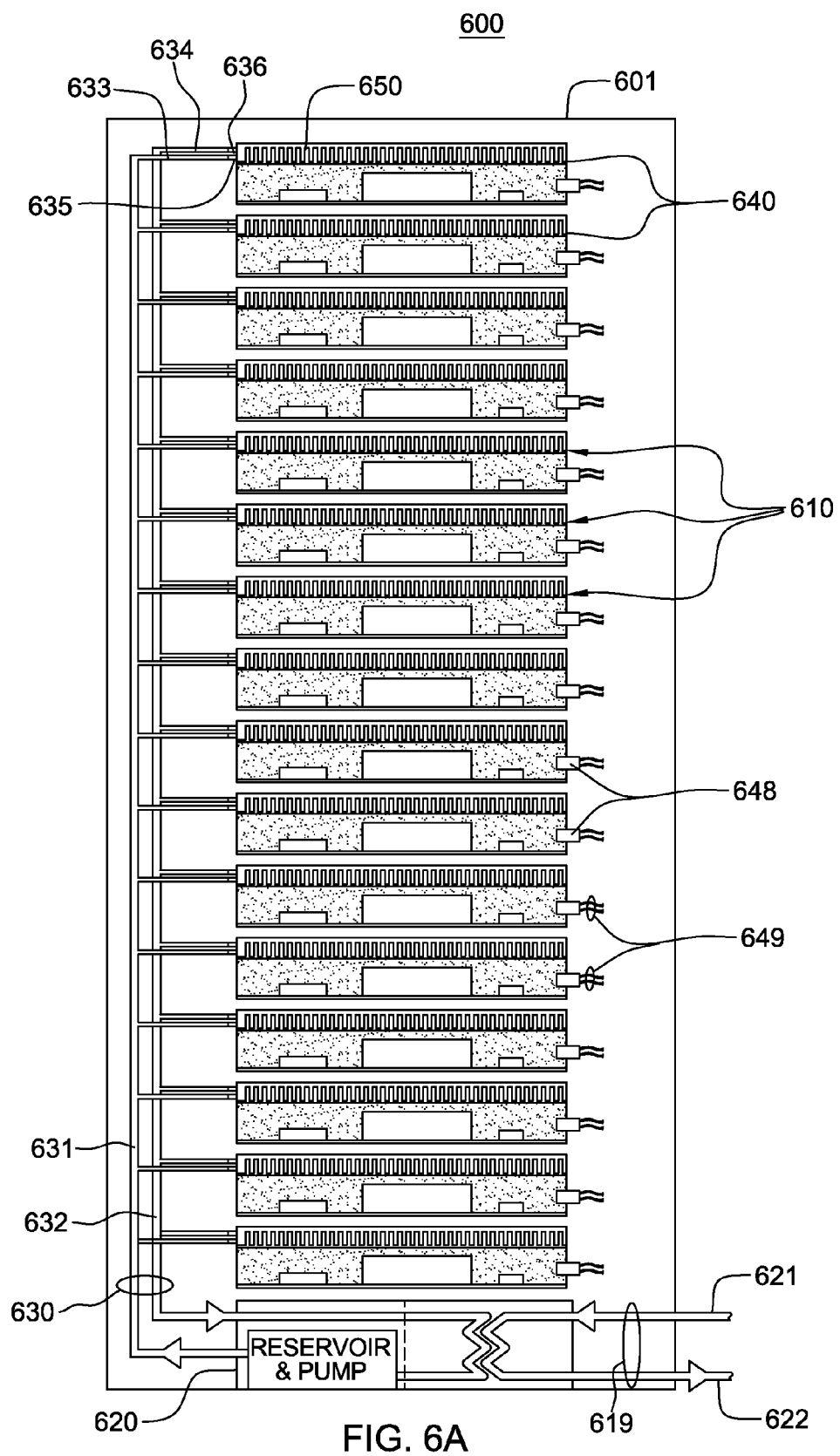
FIG. 6A is an elevational view of an alternate embodiment of a liquid-cooled electronics rack with immersion-cooling of electronic systems thereof, in accordance with one or more aspects of the present invention.

FIG. 6A is a schematic of one embodiment of a liquid-cooled electronics rack, generally denoted 600, employing immersion-cooling of electronic systems, in accordance with an aspect of the present invention. As shown, liquid-cooled electronics rack 600 includes an electronics frame 601 containing a plurality of electronic systems 610 disposed, in the illustrated embodiment, horizontally so as to be stacked within the rack. By way of example, each electronic system 610 may be a server unit of a rack-mounted plurality of server units. In addition, each electronic system includes multiple electronic components to be cooled, which in one embodiment, comprise multiple different types of electronic components having different heights and/or shapes within the electronic system.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic systems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic system 610 via the respective liquid-cooled vapor condenser 650 is transferred from the system coolant via the coolant return manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane of the electronics rack in order to provide electrical and network connections 649 to the electronic system disposed within the sealed housing when the electronic system is operatively positioned within the sealed housing and the sealed housing is operatively positioned within the electronics rack.

Figure 6B:
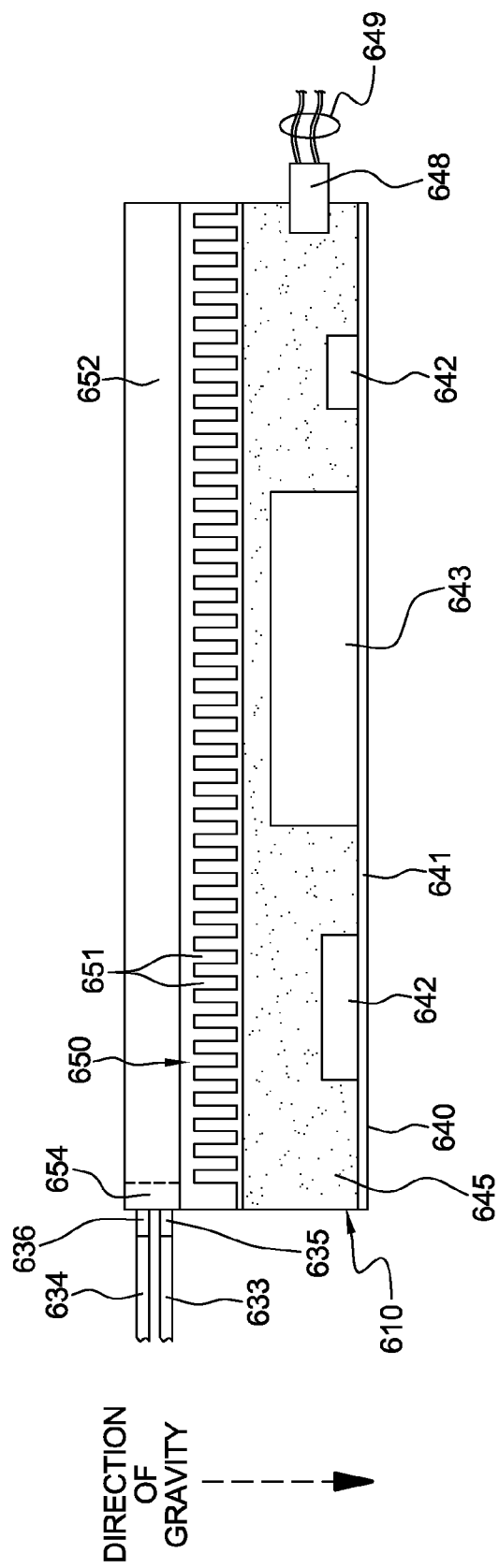
FIG. 6B is a cross-sectional elevational view of one immersion-cooled electronic system of the liquid-cooled electronics rack of FIG. 6A, in accordance with one or more aspects of the present invention.

As illustrated in FIG. 6B, electronic system 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic system with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cooler condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

Advantageously, in immersion-cooling such as depicted in FIGS. 6A & 6B, all of the components to be cooled are immersed in the dielectric fluid. The system fluid can tolerate a larger temperature rise, while maintaining component temperatures, thus allowing a smaller flow rate, and higher inlet temperatures, improving energy efficiency of the resultant cooling apparatus.

However, immersion-cooling of an electronic system, such as a server, may present problems with regards to servicing or replacement in the field of one or more of the components of the immersion-cooled electronic system. Servicing or replacing a component cooled via an immersion-cooled approach, such as described above in connection with FIGS. 6A & 6B, requires that the entire electronic system be drained, and that the sealed enclosure be opened to access the electronic component(s) to be serviced or replaced. This can be a time consuming and costly procedure to perform, particularly at the customer's data center.

In accordance with the cooled electronic systems presented herein, examples of which are depicted in FIGS. 7A-10, a hybrid liquid-cooling approach is disclosed, wherein the cooled electronic system includes an electronic system having one or more field-replaceable banks (or sets) of electronic components, and one or more cooling apparatuses facilitating cooling of the one or more field-replaceable banks of electronic components. Note that as used herein, a "bank" of electronic components refers to a plurality of electronic components of the same or different type arrayed in any pattern and grouped for operative insertion into or removal from an electronic system.

The cooling apparatus includes an enclosure at least partially surrounding and forming a compartment about, at least in part, the electronic components of a respective field-replaceable bank of electronic components, a fluid disposed within the compartment, and a heat sink associated with the electronic system. The field-replaceable bank of electronic components extends, in part, out through the enclosure to facilitate operative insertion thereof into the electronic system, for instance, into one or more respective receiving sockets of the electronic system. The electronic components of the field-replaceable bank of electronic components are, at least partially, immersed within the compartment in the fluid to facilitate immersion-cooling thereof, and the heat sink is configured and disposed to physically couple to the enclosure when the field-replaceable bank of electronic components is operatively inserted into the electronic system to facilitate rejection of heat from the fluid disposed within the compartment. In one implementation, the fluid comprises a dielectric fluid, such as one or more of the above-referenced dielectric fluids.

In one embodiment, the first heat sink comprises a liquid-cooled heat sink having at least one coolant-carrying channel in fluid communication with a coolant loop of the electronic system, and the field-replaceable bank of electronic components is operatively inserted into or removed from one or more respective receiving sockets of the electronic system without fluidically uncoupling the liquid-cooled heat sink from the coolant loop of the electronic system.

In one implementation, the liquid-cooled heat sink is fixedly mounted within the electronic system and is disposed to physically couple to at least one sidewall of the enclosure when the field-replaceable bank of electronic components is operatively inserted into the one or more respective receiving sockets of the electronic system. For instance, the liquid-cooled heat sink may include a first heat sink structure and a second heat sink structure disposed in parallel-fluid communication, with the first heat sink structure and the second heat sink structure receiving the enclosure therebetween and physically coupling to and being in thermal communication with opposite sidewalls of the enclosure when the field-replaceable bank of electronic components is operatively inserted into the one or more respective receiving sockets of the electronic system.

In one implementation, multiple thermal conductors may be disposed within the compartment of the enclosure and coupled at opposite ends thereof in thermal communication with the opposite sidewalls of the enclosure to facilitate transfer of heat from the fluid within the compartment to the opposite sidewalls of the enclosure, and hence to the first and second heat sink structures physically coupled to the opposite sidewalls of the enclosure. By way of example, the multiple thermal conductors may comprise multiple heat pipes that are interleaved within the compartment with multiple electronic components of the field-replaceable bank of electronic components. In one example, the first heat sink structure may include a first liquid-cooled cold plate, a first thermal interface pad, and a first thermally conductive clip, with the first thermally conductive clip extending, at least partially, over the first liquid-cooled cold plate and the first thermal interface pad, and the second heat sink structure may comprise a second liquid-cooled cold plate, a second thermal interface pad, and a second thermally conductive clip, with the second thermally conductive clip extending, at least partially, over the second liquid-cooled cold plate and the second thermal interface pad. The first and second thermally conductive clips may be curved at the upper portions thereof to facilitate insertion of the field-replaceable bank of electronic components into the one or more respective receiving sockets of the electronic system.

In another aspect, the liquid-cooled heat sink may be rotatably mounted within the electronic system and be configured and disposed to rotate to physically couple to, for instance, a cover plate of the enclosure when the field-replaceable bank of electronic components is operatively inserted into the one or more respective receiving sockets of the electronic system. For instance, the liquid-cooled heat sink may include a liquid-cooled cold plate rotatably mounted to a coolant inlet coupling and a coolant outlet coupling, which are fluidically coupled to the coolant loop of the electronic system. In one implementation, the coolant inlet coupling and the coolant outlet coupling engage the liquid-cooled cold plate along an axis of rotation thereof, and the heat sink further includes at least one inlet sealing ring disposed between the coolant inlet coupling and the liquid-cooled cold plate, and at least one outlet sealing ring disposed between the coolant outlet coupling and the liquid-cooled cold plate, which facilitate fluid-tight coupling of the liquid-cooled cold plate to the coolant inlet and coolant outlet couplings, respectively, notwithstanding rotation of the liquid-cooled cold plate about the axis of rotation thereof.

As a further example, a thermal interface material may be disposed between the liquid-cooled cold plate and the cover plate of the enclosure (in one embodiment) to ensure, for instance, that the liquid-cooled cold plate is in good thermal communication with the cover plate of the enclosure when the field-replaceable bank of electronic components is operatively inserted into the one or more respective receiving sockets of the electronic system, and the liquid-cooled cold plate is rotated to physically couple to the cover plate of the enclosure. As in the above-summarized embodiment, one or more thermal conductors may project within the compartment; for instance, downwards from an upper, inner surface of the enclosure or the cover plate. In one embodiment, multiple thermal conductors may be provided interleaved within the compartment with multiple electronic components of the field-replaceable bank of electronic components to facilitate transfer of heat from the fluid within the compartment to the cover plate of the enclosure, for instance, by facilitating local condensing of fluid vapor within the compartment. In one implementation, the thermal conductors may comprise multiple heat pipes.

In a further variation, the liquid-cooled heat sink may be movably coupled to the coolant loop of the electronic system to facilitate coupling thereof to, for instance, a cover plate of the enclosure when the field-replaceable bank of electronic components is operatively inserted into the one or more respective receiving sockets of the electronic system. For instance, the coolant loop of the electronic system may include sufficient flexibility and tube length to allow for the liquid-cooled heat sink to be moved aside within the electronic system to facilitate operative insertion or removal of the field-replaceable bank of electronic components within the electronic system without fluidically uncoupling the liquid-cooled heat sink from the coolant loop of the electronic system. In one embodiment, the liquid-cooled heat sink may include a coolant inlet port and a coolant outlet port disposed along a common edge of the liquid-cooled heat sink, with the coolant inlet port and coolant outlet port being fluidically coupled to the coolant loop of the electronic system. As an enhancement, one or more thermal conductors may be disposed within the compartment and project downwards into the compartment from an upper surface of, for instance, the cover plate of the enclosure. The multiple thermal conductors may be interleaved within the compartment with multiple electronic components of the field-replaceable bank of electronic components and facilitate transfer of heat from the fluid within the compartment to the cover plate of the enclosure, and hence to the liquid-cooled heat sink physically coupled thereto.

As noted, in one embodiment, one or more thermal conductors are disposed within the compartment of the enclosure and project from one or more inner surfaces or walls of the enclosure into the compartment to facilitate transfer of heat from the fluid to the heat sink. For instance, the one or more thermal conductors may comprise one or more heat pipes. In one implementation, multiple heat pipes project from at least one inner surface of the enclosure into the compartment to facilitate transfer of heat from the fluid to the heat sink, and are interleaved within the compartment with multiple electronic components of the field-replaceable bank of electronic components. For instance, the multiple heat pipes may be in thermal communication at opposite ends thereof with opposite sides or inner surfaces of the enclosure to facilitate transfer of heat from the fluid within the compartment to the opposite sides of the enclosure, and hence to (for example) the first and second heat sink structures of a fixedly-disposed, liquid-cooled heat sink such as disclosed herein. By way of specific example, the field-replaceable bank of electronic components could comprise a field-replaceable bank of dual-in-line memory modules (DIMMs).

In further aspects described herein, the cooling apparatus may include one or more compliant layers associated with the enclosure, for instance, either as a layer within the compartment coupled to an upper, inner surface of the enclosure, and/or as the upper cover and/or as the base of the enclosure. The one or more compliant layers engage or are coupled to the field-replaceable bank of electronic components when the cooling apparatus is operatively positioned to facilitate cooling the field-replaceable bank of electronic components, for instance, engage a portion thereof, and thereby provide compliance to facilitate secure docking of the field-replaceable bank of electronic components into the one or more respective receiving sockets of the electronic system.

Figure 10:
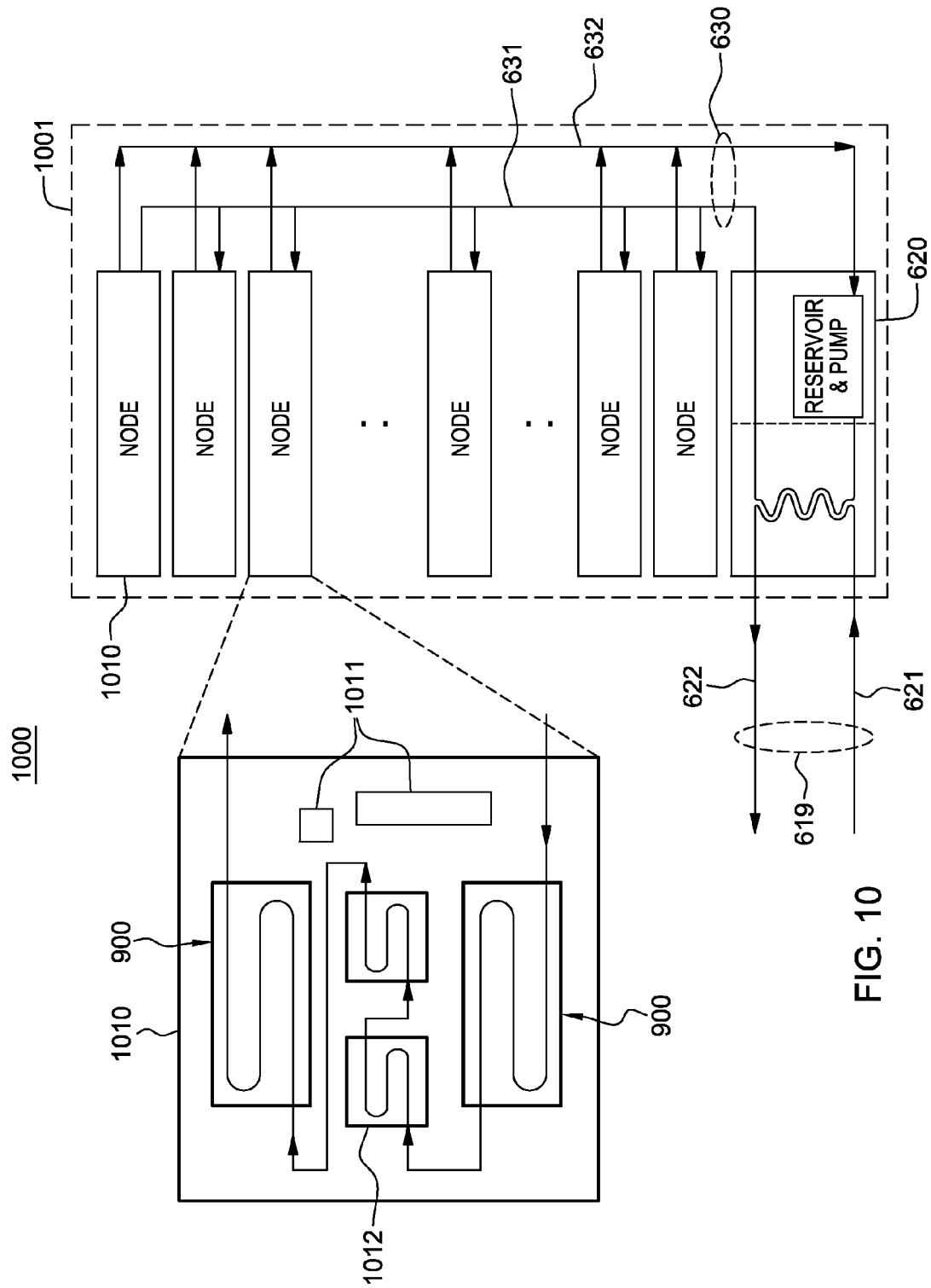
FIG. 10 is a schematic of one embodiment of a cooled electronics rack comprising one or more cooled electronic systems having one or more field-replaceable banks of electronic components and associated cooling apparatuses, in accordance with one or more aspects of the present invention.

More particularly, and in one example only, the cooling apparatuses and cooling methods disclosed herein solve the issue of DIMM cooling and replaceability by providing an immersion-cooling enclosure which facilitates cooling an entire field-replaceable DIMM bank via, for instance, pool boiling of dielectric fluid within the enclosure and local vapor condensation. The field-replaceable bank of electronic components (e.g., DIMMs) and the immersion-cooling enclosure of the cooling apparatus are readily inserted into and removed as a single unit from, for instance, multiple DIMM-receiving sockets of an electronic system comprising one or more field-replaceable banks of electronic components and other electronic components (as illustrated in FIG. 10). In this manner, as one or more DIMMs within a bank of field-replaceable DIMMs fail, the immersion-cooled DIMM bank may be removed as an entire unit and replaced as a whole, with the enclosure comprising the one or more failing DIMMs being returned to, for instance, a manufacturer for individual DIMM replacement. This approach is particularly advantageous in cases where several DIMMs within a field-replaceable bank of DIMMs are allowed to fail before replacement of the entire bank is required.

By way of specific example, multiple DIMMs may be installed as an immersion-cooled DIMM bank, where the DIMMs are cooled by pool boiling of an encapsulated dielectric fluid. In one embodiment, the substrates or boards of the bank of DIMMs extend out from the enclosure and are configured so that they may be plugged into a set of receiving sockets (or slots) on or in, for instance, a motherboard of the electronic system. In one implementation, the bank of DIMMs extend through a lower, compliant base of the enclosure, such as a polymeric plate, which provides compliance or flexibility to facilitate insertion of the bank of DIMMs in operative position within the receiving sockets of the electronic system. In operation, vapor produced within the compartment of the enclosure is advantageously condensed locally through contact with one or more thermal conductors extending from one or more inner surfaces of the enclosure into the compartment and (in one implementation) interleaved with the multiple DIMMs. That is, as one example, each thermal conductor is disposed between a respective pair of adjacent DIMMs. The thermally conductive surfaces of the thermal conductors may be, in one implementation, surfaces of solid thermal conductors or surfaces of heat pipes, that are attached at (for instance) the upper, inner surface of the enclosure, or at one or both of two opposite, inner surfaces of the enclosure.

In one implementation, the sides of the enclosure may be fabricated of a thermally conductive material, such as a metal, and the enclosure may have coupled thereto one or more liquid-cooled heat sinks or cold plates. The cover or upper plate of the enclosure could be made either of a compliant material, such as polymer, or a thermally conductive material, such as metal. As noted, the cover or upper plate could also be in thermal communication with a liquid-cooled cold plate, either rotatable or movable to physically couple to the cover plate of the enclosure. In such an embodiment, the multiple thermal conductors would be in thermal communication with, for instance, the upper surface of the enclosure, rather than (or in addition to) opposing sides of the enclosure. As vapor condenses, heat released is conducted by the thermal conductors to the associated heat sink(s).

In general, one possible approach to immersion-cooling DIMMs is to require the DIMM cooling enclosure to be sealed along the electronic system board surface, which would make field replacement of the DIMM(s) more difficult. In contrast, immersion-cooling of individual DIMMs is impractical and costly due to space limitation, and the number of DIMMs in a typical electronic system, such as a server. The cooled electronic systems and cooling apparatuses disclosed herein solve these issues by packaging the enclosure around, for instance, a set of DIMMs alone (generally referred to herein as a field-replaceable bank of electronic components), making the entire DIMM bank readily replaceable at the end-user's data center. For servicing, the faulty bank could then be sent to, for instance, a manufacturer where the failed DIMM(s) could be replaced, and the enclosure refilled and prepared for return to operation, resulting in minimal chance for fluid loss at the data center and improved service quality. The advantage of this approach is even greater in cases where several DIMMs in a bank are allowed to fail before a repair event is initiated, and the bank is returned to the factory for repair and/or maintenance.

As noted, FIGS. 7A-10 depict various embodiments of a hybrid liquid-cooling approach such as disclosed herein. In these embodiments, cooled electronic systems are provided which include an electronic system comprising one or more field-replaceable banks (or sets) of electronic components and a cooling apparatus that facilitates cooling of the field-replaceable bank(s) of electronic components. As described further below, full or partial immersion-cooling of the field-replaceable bank of electronic components is provided, for instance, utilizing pool boiling of the immersion-cooling fluid, and dissipated heat is rejected to one or more heat sinks associated with the electronic system. In the examples presented, the heat sinks are liquid-cooled heat sinks, by way of example only.

FIGS. 7A-7D depict a first embodiment, wherein the liquid-cooled heat sink is rigidly affixed to the electronic system, for instance, to a motherboard of the electronic system, and is configured and disposed to physically couple to or engage the enclosure of the cooling apparatus when the field-replaceable bank of electronic components is operatively inserted into the electronic system. In this example, the liquid-cooled heat sink may be hard-plumbed to a liquid coolant loop of the electronic system, for instance, through which an auxiliary or system coolant (such as water or an aqueous-based solution) flows.

Figure 8A:
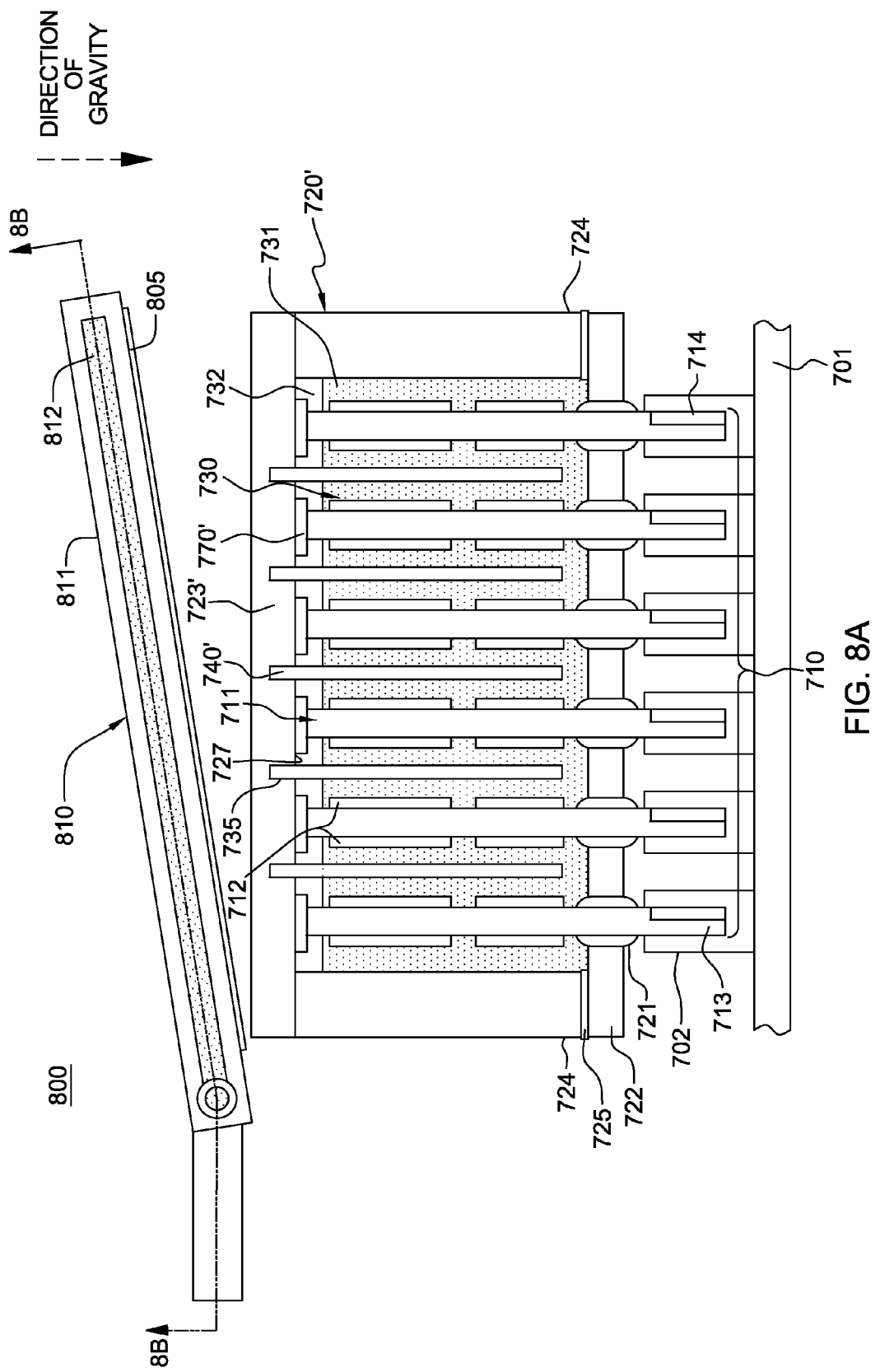
FIG. 8A is a cross-sectional elevational view of another cooled electronic system comprising a field-replaceable bank of electronic components of an electronic system and a further embodiment of a cooling apparatus therefor, in accordance with one or more aspects of the present invention.
Figure 8B:
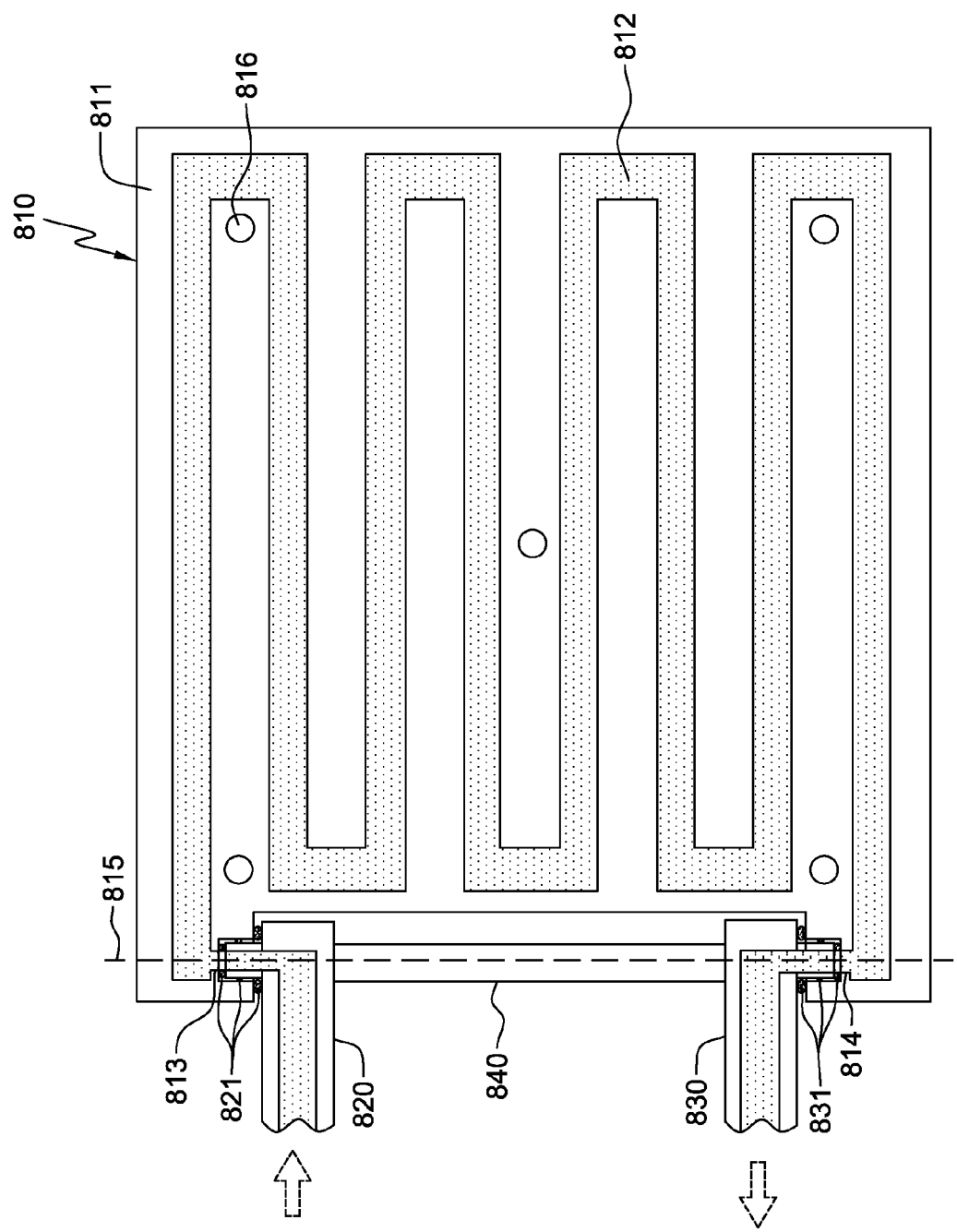
FIG. 8B is a top plan view of a rotatable, liquid-cooled heat sink of the cooled electronic system of FIG. 8A, taken along line 8B-8B thereof, in accordance with one or more aspects of the present invention.
Figure 8C:
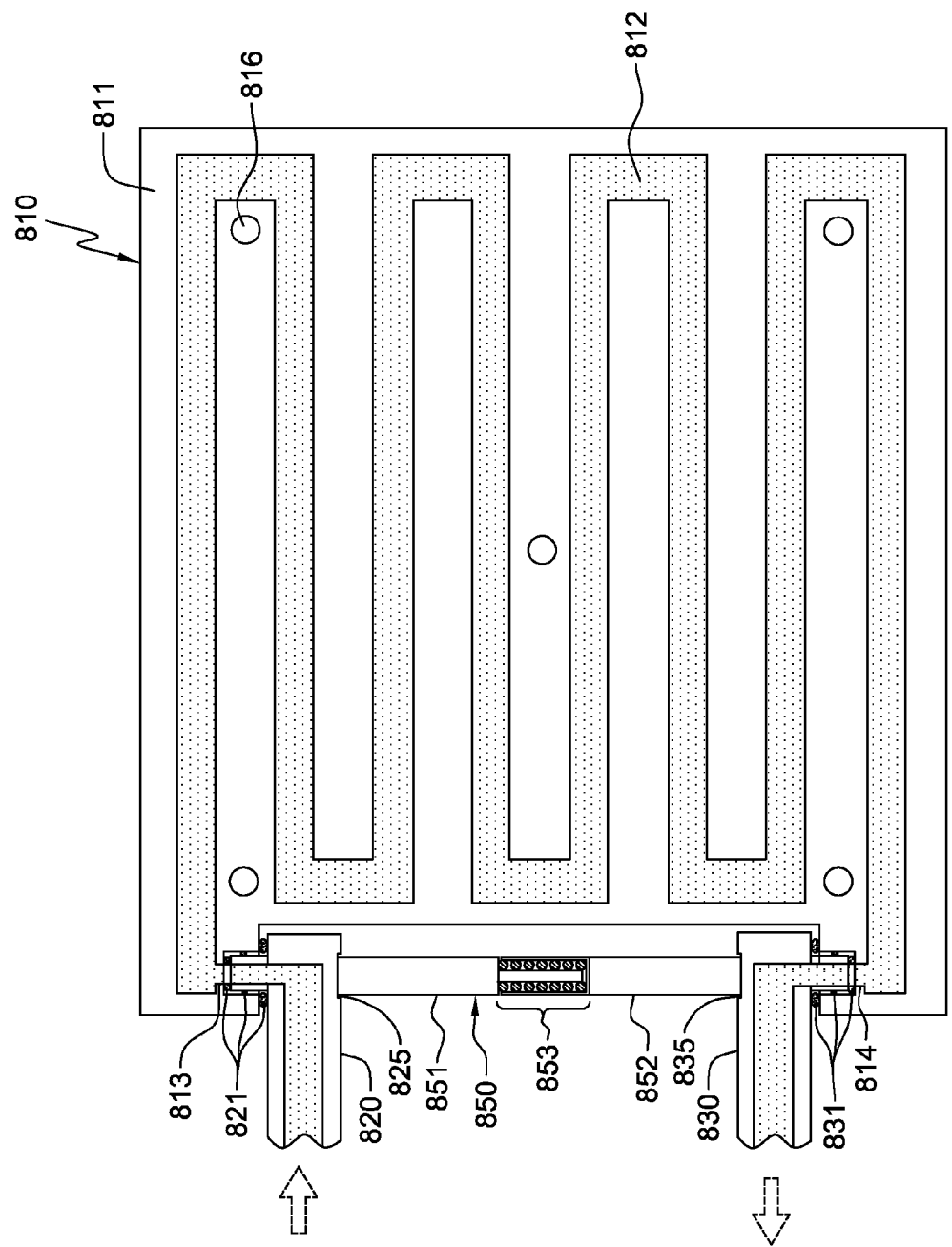
FIG. 8C is a top plan view of an alternate embodiment of the rotatable, liquid-cooled heat sink of FIG. 8B for the cooled electronic system of FIG. 8A, in accordance with one or more aspects of the present invention.

FIGS. 8A-8C illustrate an alternate embodiment of a liquid-cooled heat sink associated with the electronic system. In this embodiment, the liquid-cooled heat sink comprises a liquid-cooled cold plate that is rotatable (e.g., by about 90°) to allow for the insertion or removal of the field-replaceable bank of electronic components and surrounding enclosure from the electronic system, and to allow for the rotatable engaging of the cold plate onto one or more surfaces of the enclosure when the filed-replaceable bank of electronic components is operatively inserted into the electronic system.

Figure 9A:
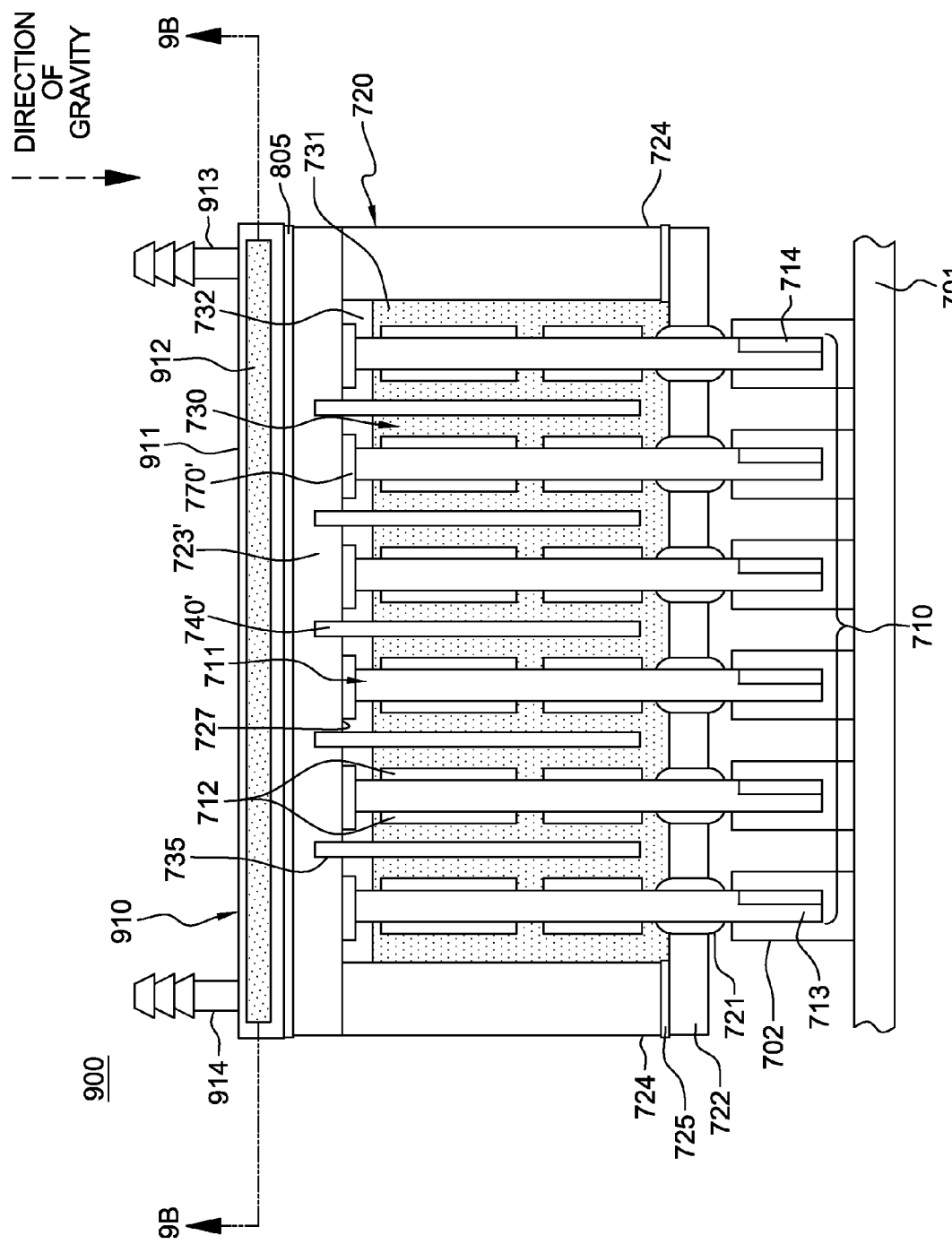
FIG. 9A is a cross-sectional elevational view of a cooled electronic system comprising a field-replaceable bank of electronic components of an electronic system, and a further embodiment of a cooling apparatus therefor, in accordance with one or more aspects of the present invention.
Figure 9B:
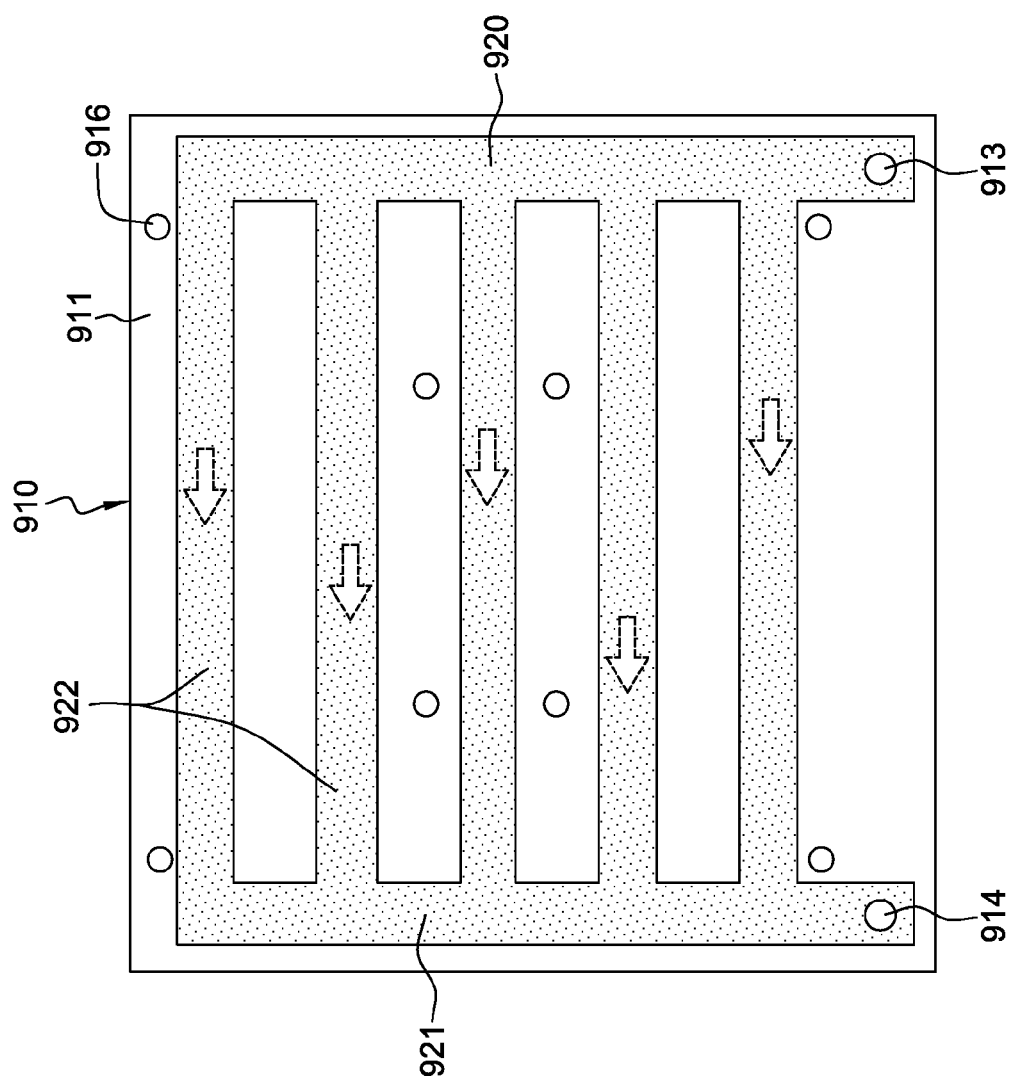
FIG. 9B is a cross-sectional plan view of the movable liquid-cooled heat sink of the cooled electronic system of FIG. 9A, taken along line 9B-9B thereof, in accordance with one or more aspects of the present invention.

By way of further example, FIGS. 9A & 9B depict another embodiment of a liquid-cooled heat sink associated with the electronic system, wherein (in this example) the heat sink is movable via, for instance, the use of flexible tubing of sufficient length to allow for the liquid-cooled heat sink to be readily coupled to or uncoupled from the enclosure surrounding the field-replaceable bank of electronic components.

FIG. 10 depicts one example of a cooled electronics rack employing one or more cooled electronic systems such as those summarized above. Note that in each of the embodiments illustrated in FIGS. 7A-10, the field-replaceable bank of electronic components may be operatively inserted into or removed from, for instance, one or more respective receiving sockets of the electronic system without fluidically uncoupling the liquid-cooled heat sink from the coolant loop of the electronic system.

Figure 7B:
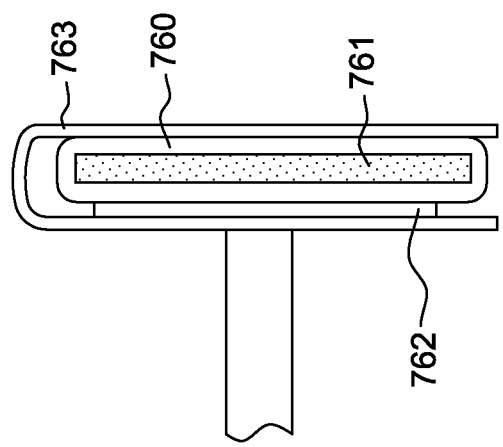
FIG. 7B is a partial cross-sectional elevational view of the heat sink of the cooling apparatus of FIG. 7A, taken along line 7B-7B thereof, in accordance with one or more aspects of the present invention.
Figure 7C:
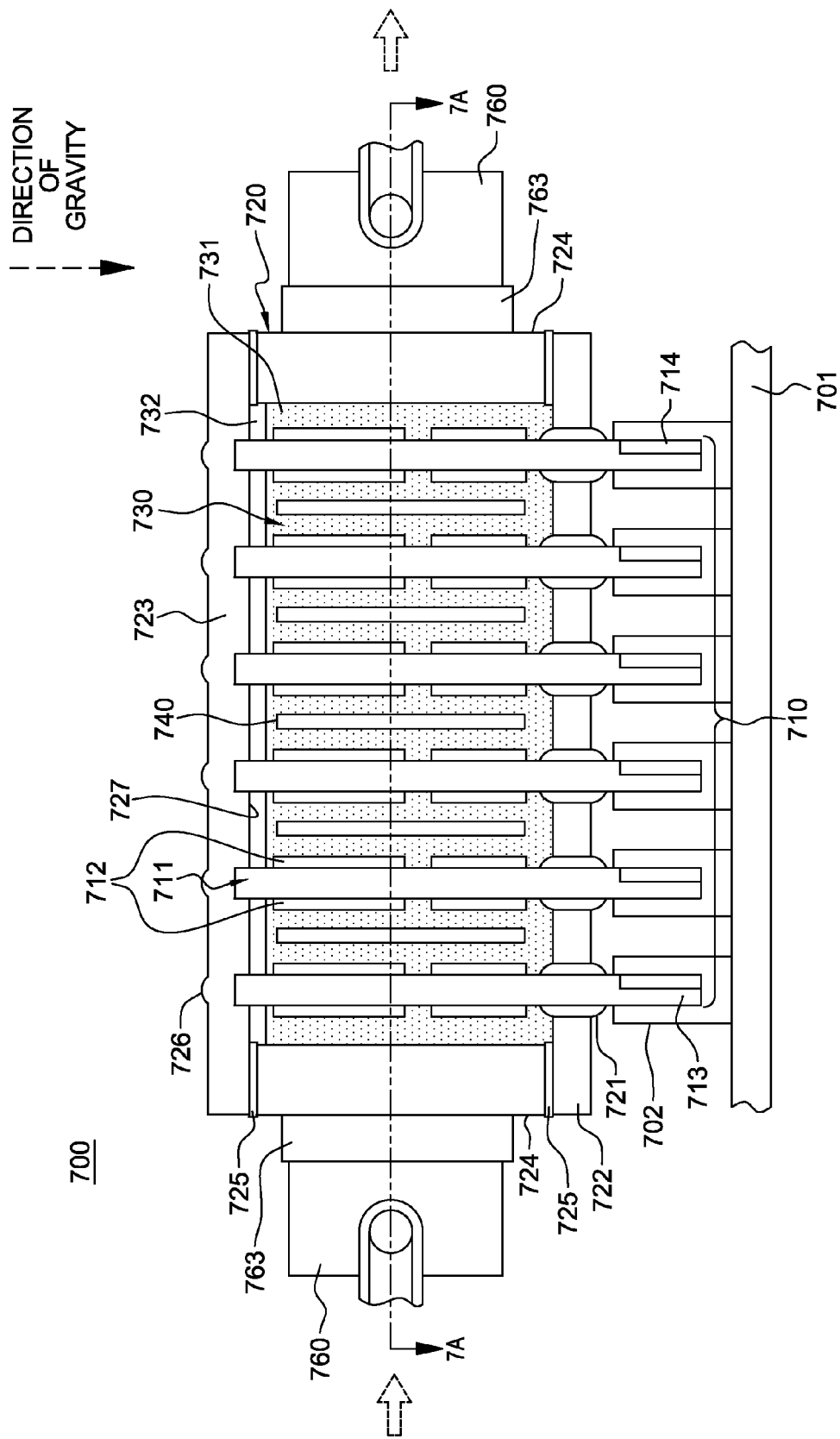
FIG. 7C is a cross-sectional elevational view of the cooled electronic system of FIG. 7A, taken along line 7C-7C thereof, in accordance with one or more aspects of the present invention.

Referring collectively to FIGS. 7A-7C, one example of a cooled electronic system 700 is depicted, in accordance with one or more aspects of the present invention. As shown, cooled electronic system 700 includes an electronic system 701 with a plurality of receiving sockets 702 for operatively receiving a field-replaceable bank 710 of electronic components 711, which (in one example) may comprise a set of dual-in-line memory modules (DIMMs). Each electronic component 711 includes, in the depicted example, multiple components 712 (such as memory chips or modules) disposed (in this example) on opposite main sides of a board or substrate 713. A cooling apparatus is provided for the field-replaceable bank 710 of electronic components 711, which includes an enclosure 720 that at least partially surrounds and forms a compartment 730 about, at least in part, the electronic components 712 of the field-replaceable bank 710 of electronic components. As illustrated in FIG. 7A, the substrates 713 of electronic components 711 of the field-replaceable bank of components extend out through, in part, enclosure 720, for instance, through respective openings in a base plate 722 of enclosure 720. In one example, enclosure 720 includes base plate 722, a cover plate 723, and one or more side walls 724, which may be sealed 725 together via, for instance, an adhesive or epoxy material, to form fluid-tight compartment 730.

A potting material 721 is also provided in the base plate 722 openings about the substrates 713 extending through base plate 722 of enclosure 720. The openings in base plate 722 are appropriately sized to facilitate projection of the substrates 713 from the enclosure and thereby facilitate operative docking thereof in the respective receiving sockets 702 of electronic system 701. In one example, base plate 722 is a flexible (or compliant) material, such as a polymeric material, which provides insertion compliance for the field-replaceable bank 710 of electronic components 711. Communication and electrical connectors 714 associated with substrates 713 of the field-replaceable bank 710 of electronic components 711 facilitate operative coupling of the electronic components 711 to the electronic system 701, for instance, via connection to corresponding system-level connectors (not shown) with docking of the bank of electronic components into the receiving sockets 702.

Cover or upper plate 723 may also be a flexible (or compliant) plate, such as a polymeric plate, and may include grooves or notches in the inner surface 727 thereof (i.e., the surface partially defining compartment 730) sized to accommodate the electronic components 711, as illustrated in FIG. 7C. Nubs 726 may be provided in the upper surface of upper plate 723 aligned to the respective electronic components 711 to facilitate, for instance, applying downward pressure on the electronic components 711 to ensure good electrical, operative coupling of the field-replaceable bank of electronic components within the respective receiving sockets 702 of electronic system 701.

As illustrated, a fluid 731 substantially fills or partially fills compartment 730, for instance, leaving a small vapor space 732 in the upper portion thereof. This fluid may comprise a dielectric fluid such as described above, which surrounds the electronic components 711 within compartment 730 of enclosure 720. In this manner, enclosure 720 is an immersion-cooling enclosure that is fully supported about, and coupled and sealed to the field-replaceable bank 710 of electronic components 711.

In one implementation, the side walls 724 of enclosure 720 are fabricated of a thermally conductive material, such as a metal, and a liquid-cooled heat sink 750 is provided associated with electronic system 701. As noted, in one instance, liquid-cooled heat sink 750 may be rigidly affixed to the electronic system, such as to a main board of the electronic system, and hard-plumbed to a coolant loop of the electronic system so as to be part of the electronic system. As illustrated in FIG. 7A, liquid-cooled heat sink 750 includes a first heat sink structure 754 and a second heat sink structure 755 that are coupled in parallel-fluid communication between a coolant inlet coupling 752 and a coolant outlet coupling 753 via appropriately sized coolant-carrying tubing 756, 757, respectively. The connecting tubing 756, 757 and coolant inlet and outlet couplings 752, 753 may be, for instance, soldered together or formed integral with each other, by way of example.

As illustrated in FIG. 7A, first heat sink structure 754 and second heat sink structure 755 are configured and disposed to physically couple to opposite sidewalls 724 of enclosure 720 with operative insertion of the field-replaceable bank of electronic components into the electronic system, for instance, with operative insertion of the field-replaceable bank of electronic components into one or more respective receiving sockets of the electronic system. This physical coupling of the enclosure to the first and second heat sink structures 754, 755 of the heat sink 750 is accomplished without fluidically uncoupling the liquid-cooled heat sink 750 from the coolant loop of the electronic system. In the example depicted, first heat sink structure 754 comprises a first liquid-cooled cold plate 760, and second heat sink structure 755 comprises a second liquid-cooled cold plate 770, each of which includes one or more coolant-carrying channels 761, 771, respectively, which allow for the flow of liquid coolant therethrough. In the depicted embodiment, coolant flows through coolant inlet couplings 752 and bifurcates for flow through the respective liquid-cooled cold plates 760, 770 disposed at the opposite sides 724 of the enclosure 720 when the field-replaceable bank 710 of electronic components 711 is operatively inserted into the electronic system.

In the embodiment depicted, first heat sink structure 754 further includes a first thermal interface pad 762 and a first thermally conductive clip 763 extending, at least partially, over the first liquid-cooled cold plate 760 and the first thermal interface pad 762. One embodiment of first thermally conductive clip 763 is illustrated by way of example in FIG. 7B, wherein the clip is depicted to comprise a U-shaped clip which wraps over the first thermal interface pad 762 and first liquid-cooled cold plate 760. In one embodiment, first thermally conductive clip 763 comprises a smooth clip, such as a smooth metal clip that is rounded at its upper corners, so as not to interfere with insertion or removal of the enclosure 720 comprising the field-replaceable bank 710 of electronic components.

Second heat sink structure 755 comprises, in the depicted example, a similar structure to first heat sink structure 754. For instance, in addition to second liquid-cooled cold plate 770, a second thermal interface pad 772 may be provided, along with a second thermally conductive clip 773 which facilitate holding second thermal interface pad 772 in good thermal contact against second liquid-cooled cold plate 770, and is configured as described above in connection with the first thermally conductive clip 763 of first heat sink structure 754 depicted in FIG. 7B. In one embodiment, the first and second thermal interface pads 762, 772 comprise a compliant, thermally conductive material that facilitates establishing a good thermal transfer path from the opposite sidewalls 724 of enclosure 720 to the first and second heat sink structures 754, 755 of the liquid-cooled heat sink 750, as illustrated (for instance) in FIG. 7A.

More particularly, in one embodiment, the first liquid-cooled cold plate 760 is disposed adjacent to and in thermal communication with a first inner surface or wall 728 of enclosure 720, and second liquid-cooled cold plate 770 is disposed adjacent to and in thermal communication with a second inner surface or wall 729 of enclosure 720, which in the embodiment of FIGS. 7A-7C, are opposing, inner surfaces or walls of the enclosure. Heat is conducted through the thermally conductive sidewalls from the opposing, inner walls 728, 729 to the respective first and second liquid-cooled cold plate 760, 770. As illustrated in FIG. 7A, the respective inner walls 728, 729 of enclosure 720 may include recesses or notches 735 sized and configured to receive therein opposite ends of thermal conductors 740. Note that the thermal conductors 740 may be, in one example, soldered into the recesses or notches 735 in the opposing, inner walls 728, 729 of enclosure 720 to facilitate good thermal conduction from the thermal conductors 740 into the opposing sidewalls, and hence to the first and second liquid-cooled cold plate 760, 770 of the liquid-cooled heat sink 750.

In the depicted implementation, thermal conductors 740 may each comprise a solid thermally conductive material (e.g., a metal), or alternatively, may comprise heat pipes which facilitate transfer of heat from fluid 731 within compartment 730 to the first and second liquid-cooled cold plates 760, 770 for dissipation to the auxiliary coolant, that is, the liquid coolant passing through liquid-cooled heat sink 750. Note also that the one or more coolant-carrying channels 761, 771 through the respective liquid-cooled cold plates 760, 770 may comprise any desired configuration, such as a single large coolant flow chamber, multiple parallel coolant flow channels, a single coolant flow channel of any desired configuration, etc.

As noted, as a specific example, the field-replaceable bank 710 of electronic components 711 may comprise a bank of DIMMs which are immersion-cooled using a cooling apparatus such as depicted in FIGS. 7A-7C. In one embodiment, the enclosure could comprise metal on its sides, and a suitable dielectric-compatible polymer material, such as ethylene propylene diene monomer (EPDM) rubber, as its base and cover plates. The upper polymer plate may be made with notches into which the DIMMs can slip into, as well as nubs over the DIMMs to provide an operator with an indication of where to press down to ensure that the DIMMs are seated firmly into their respective receiving sockets of the electronic system, for instance, on a printed circuit board. The base plate may also be made of such a polymer material to allow additional flexibility during installation of the DIMMs into their sockets.

In one fabrication approach, the DIMMs are inserted into the enclosure through the openings in the base polymer plate. Once inserted, the space around the DIMMs is potted, sealing the space between the DIMMs, the electronic system circuit board, and the polymer base plate. The polymer cover and base plates may also be sealed to the metal side wall(s) using, for instance, either epoxy alone, or epoxy in combination with mechanical attachments, such as mechanical fasteners. The enclosure is partially filled with dielectric fluid, and the upper polymer plate is attached and sealed, defining the enclosure about the bank of electronic components. In one implementation, two holes may be made in the cover plate 723, and dielectric fluid forced into compartment 730 to replace the existing air. Once the air is removed, the holes may be sealed with epoxy or potting material.

In the depicted embodiment, the thermal conductors 740 are interleaved with the electronic components 711. As noted, these thermal conductors may comprise heat pipes or heat pipe fins inserted into the spaces between adjacent DIMMs. The heat pipes act (in one implementation) as condensers to locally condense any dielectric fluid vapor formed within the compartment due to dielectric fluid boiling from one or more surfaces of electronic components 711 being cooled. Heat released during condensation is conducted by the heat pipes (or thermal conductors) to the sides of the enclosure, and from there to the liquid-cooled cold plates, through which water (or any suitable auxiliary coolant) flows to carry away rejected heat from the heat pipes.

Figure 7D:
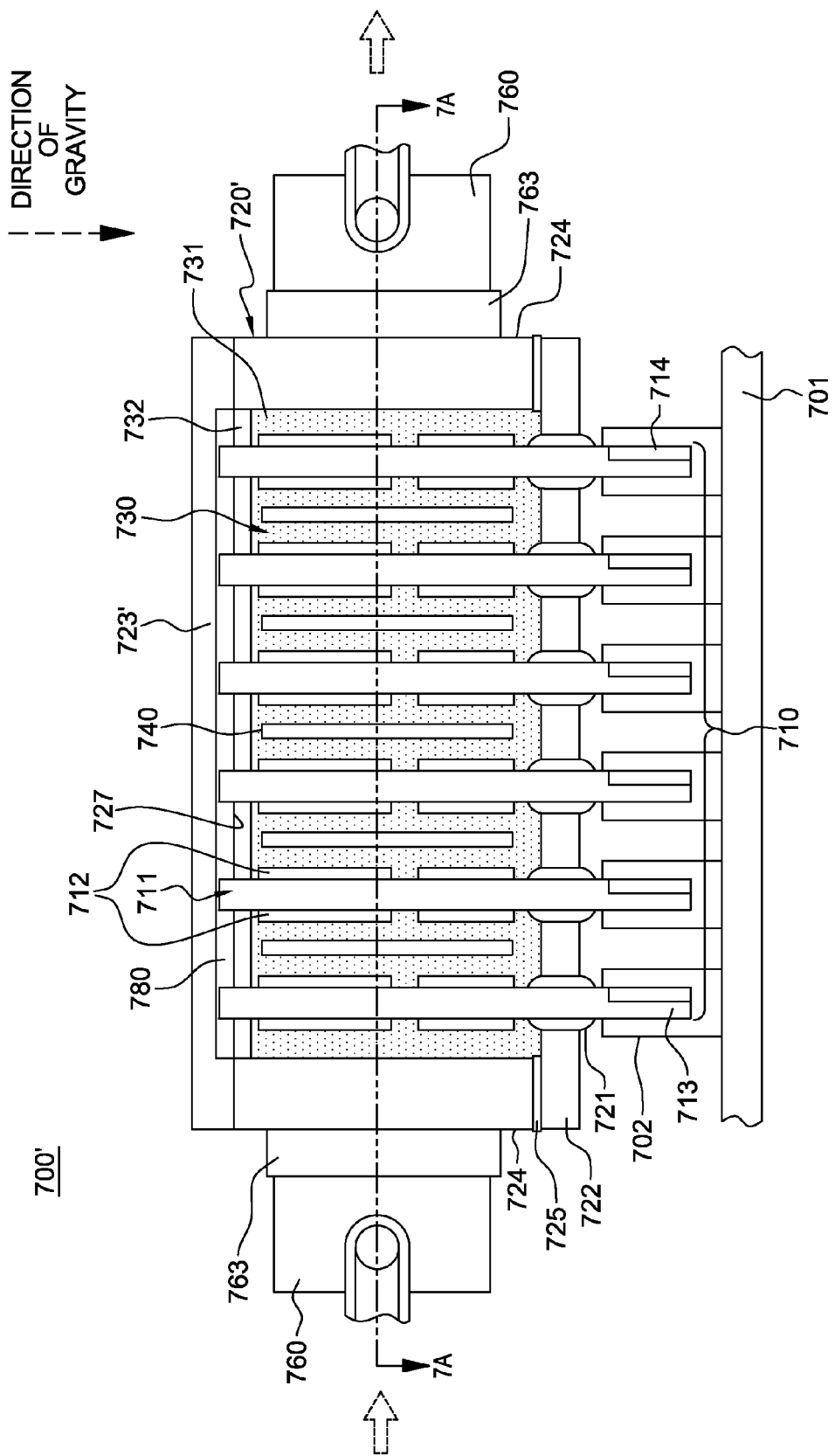
FIG. 7D is a cross-sectional elevational view of an alternate embodiment of the cooled electronic system of FIGS. 7A-7C, in accordance with one or more aspects of the present invention.

FIG. 7D depicts an alternate embodiment 700' of the cooled electronic system 700 of FIGS. 7A-7C, wherein the cover or upper plate 723' of enclosure 720' comprises a rigid plate, such as a metal plate, for additional stiffness, which allows the plate to be soldered at its edges to the metal sidewall(s) 724 of enclosure 720'. In this embodiment, a flexible layer 780 of material, such as a layer of polymeric material, may be provided on the upper, inner surface of enclosure 720', between the electronic components 711 and upper plate 723' of the enclosure 720' to provide compliance to the electronic components and thereby facilitate operative docking of the field-replaceable bank 710 of electronic components 711 within the respective receiving sockets 702 of electronic system 701. Advantageously, the presence of flexible layer 780 reduces chances of damaging the electronic components 711 (e.g., DIMMs) when an external force is applied to the enclosure 720 during installation of the field-replaceable bank 710 of electronic components into the receiving sockets 702.

FIGS. 8A & 8B depict a further variation, generally denoted 800, of the cooled electronic system 700 of FIGS. 7A-7C. In cooled electronic system 800, the heat sink comprises a rotatable heat sink 810 and, in one embodiment, includes a rotatable liquid-cooled cold plate 811 fabricated of a thermally conductive material, such as metal, with one or more coolant-carrying channels 812 through which auxiliary liquid coolant passes. As illustrated in FIG. 8B, auxiliary coolant is received through an inlet port 813 into liquid-cooled cold plate 811 via a coolant inlet coupling 820, and is returned through an outlet port 814 via a coolant outlet coupling 830. In one embodiment, the coolant inlet and outlet couplings 820, 830 are respectively hard-plumbed to the coolant loop of the electronic system with which the rotatable heat sink 810 is associated. As illustrated, the coolant inlet coupling 820 and coolant outlet coupling 830 couple to liquid-cooled cold plate 811 along an axis of rotation 815 thereof, and the cooled electronic system further includes one or more inlet sealing rings 821 and one or more outlet sealing rings 831 disposed between the coolant inlet and outlet couplings 820, 830, respectively, and liquid-cooled cold plate 811. In the example depicted, three inlet sealing rings 821 and three outlet sealing rings 831 are provided to ensure fluid-tight coupling of the liquid-cooled cold plate 811 to the coolant inlet and outlet couplings 820, 830, notwithstanding rotating of the liquid-cooled cold plate about the axis of rotation 815 thereof. In one embodiment, the sealing rings may comprise respective O-rings. In the example depicted, the couplings are rotatable connectors coupled to the coolant loop of the electronic system with, triple O-ring seals provided to prevent coolant leak.

As illustrated in FIG. 8A, liquid-cooled cold plate 811 is sized and configured to rotate down into physical engagement with cover plate 723' of enclosure 720' when the field-replaceable bank 710 of electronic components 711 is operatively disposed within the respective receiving sockets 702 of electronic system 701. As one example, the liquid-cooled cold plate 811 may be rotatable, for instance, 90° between a vertical orientation and a horizontal orientation. In the vertical orientation, the liquid-cooled cold plate is offset from enclosure 720' to allow the field-replaceable bank of electronic components to be readily inserted into or removed from the electronic system. In the horizontal orientation, the liquid-cooled cold plate is sized and configured to physically engage cover plate 723' of enclosure 720'. Good thermal contact between cover plate 723' and the liquid-cooled cold plate 811 is facilitated by a thermal interface material 805, such as a thermal interface grease or an aluminized indium material. Once in horizontal orientation and physically engaging cover plate 723', mechanical coupling means, such as mechanical fasteners, may be used to secure the cold plate to the cover plate or the sidewalls of the enclosure through, for instance, fastener openings 816 extending through liquid-cooled cold plate 811. As noted in FIG. 8B, in one instance, the coolant-carrying channel 812 of liquid-cooled cold plate 811 may have a serpentine configuration. Alternatively, multiple parallel channels could be defined within the cold plate.

As illustrated in FIG. 8A, one or more layers of compliant material 770' may be provided between the electronic components 711 and the upper, inner surface 727 of the enclosure 720' to provide compliance to the electronic components 711 and thereby facilitate operative insertion of the field-replaceable bank 710 of electronic components 711 into the respective receiving sockets 702 of the electronic system 701. As noted above, this compliant material may comprise, by way of example, a layer of polymeric material. Notches or recesses 735 may be provided within the upper, inner surface of cover plate 723' to accommodate thermal conductors 740', which as described above, extend into compartment 730 of enclosure 720', for instance, in between adjacent electronic components 711 of the field-replaceable bank 710 of electronic components 711. In this configuration, the thermal conductors 740' thus extend downward away from the rotatable heat sink 810 coupled to enclosure 720'. In one implementation, the thermal conductors may be heat pipes, such as described above.

Note that the cooled electronic system 800 configuration of FIGS. 8A & 8B may be advantageous in spaces where the length of the enclosure 720' may be limited. In one implementation, the thermal conductors 740' (e.g., heat pipes) may be soldered to the cover plate 723', rather than to the sidewalls 724 of the enclosure, as in the examples of FIGS. 7A-7D. The design of FIGS. 8A & 8B also provides shorter thermal transfer paths from the thermal conductors 740' to the heat sink 810, and potentially allows for an increase in the liquid-cooled heat sink surface area in thermal communication with compartment 730. For example, the heat sink surface area exposed to the upper portion of the compartment could extend over the entire cover of the enclosure. A smaller average thermal conductor to liquid-cooled heat sink heat transfer distance, and larger liquid-cooled heat sink coverage area, may result in an overall smaller conductor-to-auxiliary coolant thermal resistance compared, for instance, with the sidewall-coupled, liquid-cooled heat sink(s) designs of FIGS. 7A-7D.

Note that, in the rotatable heat sink embodiment of FIGS. 8A-8B, a support rod (or bar) 840 is provided between coolant inlet coupling 820 and coolant outlet coupling 830 once the couplings and liquid-cooled cold plate are assembled as illustrated. This support bar 840 may be appropriately sized to ensure that the couplings 820, 830 remain seated to respective inlet and outlet ports 813, 814 of the cold plate, notwithstanding rotation of the liquid-cooled cold plate 811. In one embodiment, the support bar 840 may be brazed or soldered into place once the couplings are assembled as illustrated in FIG. 8B.

FIG. 8C depicts an alternate embodiment of a support bar configuration. In this embodiment, a support bar 850 is provided, sized and configured to extend between respective indentations 825, 835 in the coolant inlet and outlet couplings 820, 830, respectively. In the embodiment depicted, support bar 850 comprises a spring-loaded bar or rod, which is inserted into indentations 825, 835, and which facilitates applying pressure to the coolant inlet and outlet couplings 820, 830 to ensure their continued engagement with the rotatable liquid-cooled cold plate 811. By way of example, spring-loaded support rod 850 may include a first support rod 851 and a second support rod 852, and a spring-biasing mechanism 853 coupling first and second support rods 851, 852 and applying pressure to the couplings 820, 830 when assembled as depicted in FIG. 8C.

FIGS. 9A & 9B depict another embodiment of a cooled electronic system, generally denoted 900, in accordance with one or more aspects of the present invention. This cooled electronic system 900 is similar to cooled electronic system 800 described above in connection with FIGS. 8A & 8B, but rather than having a rotatable liquid-cooled heat sink as in the example of FIGS. 8A & 8B, a movable liquid-cooled heat sink 910 is provided. The movable liquid-cooled heat sink 910 includes a movable liquid-cooled cold plate 911 fabricated of a thermally conductive material, such as metal, and having one or more coolant-carrying channels 912 disposed therein. For instance, in the embodiment depicted in FIG. 9B, the one or more coolant-carrying channels 912 comprise multiple parallel-disposed coolant flow channels 922 coupled between a coolant supply manifold 920 and a coolant return manifold 921, which are respectively in fluid communication with a coolant inlet port 913 and a coolant outlet port 914 of the movable liquid-cooled heat sink 910.

As illustrated in FIG. 9A, the coolant inlet and outlet ports 913, 914 may include respective hose barb connectors which facilitate coupling of the movable liquid-cooled heat sink 910 to, for instance, flexible tubing of the coolant loop of the electronic system 701. This flexible tubing (not shown) is of sufficient length and flexibility to allow for the movement of movable liquid-cooled heat sink 910 over cover plate 723' of enclosure 720' when the field-replaceable bank of electronic components is operatively inserted into the electronic system, and if needed, for movement of movable liquid-cooled heat sink 910 off to the side of enclosure to facilitate removal of the field-replaceable bank of electronic components for, for instance, replacement or repair of one or more electronic components within the field-replaceable bank of components.

When operatively disposed over and engaging cover plate 723' of enclosure 720', the movable liquid-cooled heat sink 910 may be mechanically affixed to the enclosure using, for instance, mechanical fasteners extending through openings 916 provided in liquid-cooled cold plate 911. Alternatively, mechanical clips could be employed to clip the cold plate to the enclosure to ensure a good thermal transfer path between the cover plate 723' and the liquid-cooled heat sink 910 through, for instance, a thermal interface material 805, such as noted above.

Note that in the example of FIGS. 9A & 9B, the coolant inlet and outlet ports 913, 914 of the liquid-cooled cold plate 911 are disposed along a common edge of the heat sink. In one embodiment, this facilitates movability of the movable liquid-cooled heat sink within the electronic system when desired to facilitate operative insertion or removal of the field-replaceable bank of electronic components within the electronic system without requiring fluidic uncoupling of the liquid-cooled heat sink from the coolant loop of the electronic system. Note also that the cooled electronic system 900 of FIGS. 9A & 9B may advantageously be employed in a space where the length of enclosure 720' is limited. The design of FIGS. 9A & 9B also provides shorter thermal transfer paths from the thermal conductors 740' to the liquid-cooled heat sink 910, and potentially allows for an increase in the liquid-cooled heat sink surface area in thermal communication with compartment 730, that is, compared with the embodiment depicted in FIGS. 7A-7D.

FIG. 10 is a rack-level view of a hybrid liquid-cooled electronics rack, generally denoted 1000, employing selective immersion-cooling of certain electronic components of one or more electronic systems in the rack unit, in accordance with one or more aspects of the present invention. By way of example, the hybrid liquid-cooled electronics rack 1000 may include an electronics rack 1001 with a plurality of electronic systems 1010 disposed, in the illustrated embodiment, horizontally so as to be stacked within the rack. As one example, each electronic system 1010 may be a server unit of a rack-mounted plurality of server units. In addition, the electronic systems include multiple electronic components to be cooled, which (in one embodiment) comprise multiple different types of electronic components having different cooling requirements. For instance, one or more cooled electronic systems 900 may be provided comprising field-replaceable banks of immersion-cooled electronic components, such as described above in connection with the embodiment of FIGS. 9A & 9B, while other components, such as one or more processor modules may have liquid-cooled plates or immersion-cooled enclosures 1012 coupled thereto, and multiple other components 1011 may be air-cooled only via, for instance, an inlet-to-outlet airflow through electronics rack 1001, provided by one or more air-moving devices (not shown).

The cooling apparatus of FIG. 10 is shown to include one or more modular cooling units (MCUs) 620 disposed, by way of example, in a lower portion of electronics rack 1001. Each modular cooling unit 620 may be similar to the modular cooling unit described above in connection with FIGS. 4 & 6, and include, for example, a liquid-to-liquid heat exchanger for extracting heat from coolant flowing through the auxiliary (e.g., system) coolant loop 630 of the cooling apparatus and dissipating heat within, for instance, a facility coolant loop 619, comprising a facility coolant supply line 621 and a facility coolant return line 622. As one example, facility coolant supply and return lines 621, 622 couple modular coolant unit 620 to a data center facility coolant supply and return (not shown). Modular cooling unit 620 further includes an appropriately sized reservoir, pump, and optional filter for moving liquid-coolant under pressure through auxiliary or system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated, rigid tube vertically mounted to the electronics rack 1001, or to a door of the electronics rack.

In the embodiment illustrated, the coolant supply and return manifold are in fluid communication with respective coolant inlet and coolant outlet couplings of multiple electronic systems 1010 within the rack. By way of example only, a single pass of coolant within electronic system 1010 may be provided. Fluidic coupling between the electronic systems and coolant manifolds, as well as within the electronic systems between the cooled electronic systems comprising the field-replaceable banks of electronic components and the node-level coolant loop of the electronic system, can be via suitable fluid connect couplers.

In the specific example of FIG. 10, electronic system 1010 comprises a server with four immersion-cooled subsystems including, for instance, two cooled electronic systems 900, comprising field-replaceable banks of DIMMs, and two other components, such as processors which are immersion-cooled via separate enclosures 1012. In this example, only the field-replaceable banks of DIMMs are removable to facilitate removing the field-replaceable banks from the electronic system 1010. Water, or any other suitable auxiliary coolant, may be circulated at the rack level. As the coolant flows from one immersion-cooled enclosure to another, heat is discharged to the coolant, and the warm coolant is then exhausted from the electronic systems for return to the modular cooling unit 620, where it is cooled via heat exchange with the chilled facility coolant, and then pumped back to the electronic systems.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooled electronic system comprising:
   an electronic system comprising a field-replaceable bank of electronic components; and
   a cooling apparatus facilitating cooling of the field-replaceable bank of electronic components, the cooling apparatus comprising:
   an enclosure at least partially surrounding and forming a compartment about, at least in part, the electronic components of the field-replaceable bank of electronic components, and the field-replaceable bank of electronic components extending, in part, through the enclosure to facilitate operative insertion thereof into the electronic system;
   a fluid disposed within the compartment, the electronic components of the field-replaceable bank of electronic components being, at least partially, immersed within the compartment in the fluid to facilitate immersion-cooling thereof;
   a heat sink associated with the electronic system and configured and disposed to physically couple to the enclosure when the field-replaceable bank of electronic components is operatively inserted into the electronic system, the heat sink facilitating rejection of heat through the enclosure from the fluid disposed within the compartment; and wherein the heat sink comprises a liquid-cooled heat sink having at least one coolant-carrying channel in fluid communication with a coolant loop of the electronic system, and the field-replaceable bank of electronic components is operatively inserted into or removed from one or more respective receiving sockets of the electronic system without fluidically uncoupling the liquid-cooled heat sink from the coolant loop of the electronic system.

2. The cooled electronic system of claim 1, wherein the liquid-cooled heat sink is fixedly mounted within the electronic system and is disposed to physically couple to at least one sidewall of the enclosure when the field-replaceable bank of electronic components is operatively inserted into the one or more respective receiving sockets of the electronic system.

3. The cooled electronic system of claim 2, wherein the liquid-cooled heat sink comprises a first heat sink structure and a second heat sink structure disposed in parallel-fluid communication, the first heat sink structure and the second heat sink structure receiving the enclosure therebetween and physically coupling to and being in thermal communication with opposite sidewalls of the enclosure when the field-replaceable bank of electronic components is operatively inserted into the one or more respective receiving sockets of the electronic system.

4. The cooled electronic system of claim 3, further comprising multiple thermal conductors disposed within the compartment of the enclosure, and comprising opposite ends coupled to and in thermal communication with the opposite sidewalls of the enclosure to facilitate transfer of heat from the fluid within the compartment to the opposite sidewalls of the enclosure, and hence to the first and second heat sink structures physically coupled to the opposite sidewalls of the enclosure when the field-replaceable bank of electronic components is operatively inserted within the one or more respective receiving sockets of the electronic system.

5. The cooled electronic system of claim 3, wherein the first heat sink structure comprises a first liquid-cooled cold plate, a first thermal interface pad, and a first thermally conductive clip, with the first thermally conductive clip extending, at least partially, over the first liquid-cooled cold plate and the first thermal interference pad, and the second heat sink structure comprises a second liquid-cooled cold plate, a second thermal interface pad, and a second thermally conductive clip, with the second thermally conductive clip extending, at least partially, over the second liquid-cooled cold plate and the second thermal interface pad, and the first thermally conductive clip and the second thermally conductive clip each being curved at an upper portion thereof to facilitate insertion of the field-replaceable bank of electronic components into the one or more respective receiving sockets of the electronic system between the first and second heat sink structures.

6. The cooled electronic system of claim 1, wherein the liquid-cooled heat sink is rotatably mounted within the electronic system and is configured and disposed to, at least in part, rotate to physically couple to a cover plate of the enclosure when the field-replaceable bank of electronic components is operatively inserted into the one or more respective receiving sockets of the electronic system.

7. The cooled electronic system of claim 6, wherein the liquid-cooled heat sink comprises a liquid-cooled cold plate rotatably mounted to a coolant inlet coupling and a coolant outlet coupling, the coolant inlet coupling and the coolant outlet coupling being fluidically coupled to the coolant loop of the electronic system.

8. The cooled electronic system of claim 7, wherein the coolant inlet coupling and the coolant outlet coupling couple to the liquid-cooled cold plate along an axis of rotation thereof, and wherein the cooled electronic system further comprises at least one inlet sealing ring disposed between the coolant inlet coupling and the liquid-cooled cold plate, and at least one outlet sealing ring disposed between the coolant outlet coupling and the liquid-cooled cold plate, the at least one inlet sealing ring and the at least one outlet sealing ring ensuring fluid-tight coupling of the liquid-cooled cold plate to the coolant inlet coupling and to the coolant outlet coupling, notwithstanding rotating of the liquid-cooled cold plate about the axis of rotation thereof.

9. The cooled electronic system of claim 7, further comprising a thermal interface material disposed between the liquid-cooled cold plate and the cover plate of the enclosure when the field-replaceable bank of electronic components is operatively inserted into the one or more respective receiving sockets of the electronic system and the liquid-cooled cold plate is rotated to physically couple to the cover plate of the enclosure.

10. The cooled electronic system of claim 7, further comprising multiple thermal conductors projecting downwards into the compartment from an upper, inner surface of the enclosure, the multiple thermal conductors facilitating transfer of heat from the fluid within the compartment to the cover plate of the enclosure, and hence to the liquid-cooled cold plate physically coupled thereto.

11. The cooled electronic system of claim 1, wherein the liquid-cooled heat sink is movably coupled to the coolant loop of the electronic system to facilitate physically coupling thereof to a cover plate of the enclosure when the field-replaceable bank of electronic components is operatively inserted into the one or more respective receiving sockets of the electronic system without fluidically uncoupling the liquid-cooled heat sink from the coolant loop of the electronic system.

12. The cooled electronic system of claim 11, wherein the liquid-cooled heat sink comprises a coolant inlet port and a coolant outlet port disposed along a common edge of the liquid-cooled heat sink, the coolant inlet port and the coolant outlet port being fluidically coupled to the coolant loop of the electronic system.

13. The cooled electronic system of claim 11, further comprising multiple thermal conductors disposed within the compartment and projecting downwards into the compartment from an upper, inner surface of the cover plate of the enclosure, the multiple thermal conductors being interleaved within the compartment with multiple electronic components of the field-replaceable bank of electronic components and facilitating transfer of heat from the fluid within the compartment to the cover plate of the enclosure, and hence to the liquid-cooled heat sink physically coupled thereto.

14. The cooled electronic system of claim 1, wherein the cooling apparatus further comprises at least one compliant layer associated with the enclosure and coupled to the field-replaceable bank of electronic components, the at least one compliant layer providing compliance to facilitate secure docking of the field-replaceable bank of electronic components into the one or more respective receiving sockets of the electronic system.

15. A cooled electronics rack comprising:
- an electronics rack comprising at least one electronic system, the at least one electronic system comprising a field-replaceable bank of electronic components; and
- a cooling apparatus facilitating cooling of the field-replaceable bank of electronic components, the cooling apparatus comprising:
  - an enclosure at least partially surrounding and forming a compartment about, at least in part, the electronic components of the field-replaceable bank of electronic components, the field-replaceable bank of electronic components extending, in part, through the enclosure to facilitate operative insertion thereof into one electronic system of the at least one electronic system of the electronics rack;
  - a fluid disposed within the compartment, the electronic components of the field-replaceable bank of electronic components being, at least partially, immersed within the compartment in the fluid to facilitate immersion cooling thereof; and
  - a heat sink associated with the one electronic system and configured and disposed to physically couple to the enclosure when the field-replaceable bank of electronic components is operatively inserted into the one electronic system, the heat sink facilitating rejection of heat through the enclosure from the fluid disposed within the compartment.

16. The cooled electronics rack of claim 15, wherein the heat sink comprises a liquid-cooled heat sink having at least one coolant-carrying channel in fluid communication with a coolant loop of the one electronic system, and the field-replaceable bank of electronic components is operatively inserted into or removed from one or more respective receiving sockets of the one electronic system without fluidically uncoupling the liquid-cooled heat sink from the coolant loop of the one electronic system, and wherein the liquid-cooled heat sink is fixedly mounted within the one electronic system and is disposed to physically couple to at least one sidewall of the enclosure when the field-replaceable bank of electronic components is operatively inserted into the one or more respective receiving sockets of the one electronic system, and the liquid-cooled heat sink comprises a first heat sink structure and a second heat sink structure disposed in parallel-fluid communication, the first heat sink structure and the second heat sink structure receiving the enclosure therebetween and physically coupling to and being in thermal communication with opposite sidewalls of the enclosure when the field-replaceable bank of electronic components is operatively inserted into the one or more respective receiving sockets of the one electronic system.

17. The cooled electronics rack of claim 15, wherein the heat sink comprises a liquid-cooled heat sink having at least one coolant-carrying channel in fluid communication with a coolant loop of the one electronic system, and the field-replaceable bank of electronic components is operatively inserted into or removed from one or more respective receiving sockets of the one electronic system without fluidically uncoupling the liquid-cooled heat sink from the coolant loop of the one electronic system, wherein the liquid-cooled heat sink is rotatably mounted within the one electronic system and is configured and disposed to, at least in part, rotate to physically couple to a cover plate of the enclosure when the field-replaceable bank of electronic components is operatively inserted into the one or more respective receiving sockets of the one electronic system, the liquid-cooled heat sink comprising a liquid-cooled cold plate rotatably mounted to a coolant inlet coupling and a coolant outlet coupling, the coolant inlet coupling and the coolant outlet coupling being fluidically coupled to the coolant loop of the one electronic system.

18. The cooled electronics rack of claim 15, wherein the heat sink comprises a liquid-cooled heat sink having at least one coolant-carrying channel in fluid communication with a coolant loop of the one electronic system, the field-replaceable bank of electronic components being operatively inserted into or removed from one or more respective receiving sockets of the one electronic system without fluidically uncoupling the liquid-cooled heat sink from the coolant loop of the one electronic system, wherein the liquid-cooled heat sink is movably coupled to the coolant loop of the one electronic system to facilitate coupling thereof to a cover plate of the enclosure when the field-replaceable bank of electronic components is operatively inserted into the one or more respective receiving sockets of the one electronic system.

19. A method comprising:
- providing an electronic system comprising a field-replaceable bank of electronic components; and
- providing a cooling apparatus to facilitate cooling the field-replaceable bank of electronic components, the cooling apparatus comprising:
  - an enclosure at least partially surrounding and forming a compartment about, at least in part, the electronic components of the field-replaceable bank of electronic components, and the field-replaceable bank of electronic components extending, in part, through the enclosure to facilitate operative insertion thereof into the electronic system;
  - a fluid disposed within the compartment, the electronic components of the field-replaceable bank of electronic components being, at least partially, immersed within the compartment in the fluid to facilitate immersion-cooling thereof;
  - a heat sink associated with the electronic system and configured and disposed to physically couple to the enclosure when the field-replaceable bank of electronic components is operatively inserted into the electronic system, the heat sink facilitating rejection of heat through the enclosure from the fluid disposed within the compartment; and
  - wherein the heat sink comprises a liquid-cooled heat sink having at least one coolant-carrying channel in fluid communication with a coolant loop of the electronic system, and the field-replaceable bank of electronic components is operatively inserted into or removed from one or more respective receiving sockets of the electronic system without fluidically uncoupling the liquid-cooled heat sink from the coolant loop of the electronic system.

* * * * *